United States Patent
Yamamoto et al.

(10) Patent No.: US 9,330,782 B2
(45) Date of Patent: May 3, 2016

(54) SHIFT REGISTER AND DISPLAY DEVICE HAVING THE SAME

(75) Inventors: Kaoru Yamamoto, Osaka (JP); Yasuyuki Ogawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 76 days.

(21) Appl. No.: 13/805,769

(22) PCT Filed: Apr. 4, 2011

(86) PCT No.: PCT/JP2011/058555
§ 371 (c)(1),
(2), (4) Date: Dec. 20, 2012

(87) PCT Pub. No.: WO2012/008186
PCT Pub. Date: Jan. 19, 2012

(65) Prior Publication Data
US 2013/0100007 A1      Apr. 25, 2013

(30) Foreign Application Priority Data
Jul. 13, 2010   (JP) .................................. 2010-158675

(51) Int. Cl.
*G11C 19/18* (2006.01)
*G11C 19/28* (2006.01)
*G09G 3/36* (2006.01)

(52) U.S. Cl.
CPC *G11C 19/28* (2013.01); *G09G 3/36* (2013.01); *G09G 3/3677* (2013.01); *G11C 19/184* (2013.01); *G09G 2310/0286* (2013.01)

(58) Field of Classification Search
CPC ............... G09G 3/3677; G09G 2310/0286; G09G 3/36; G09G 3/3681; G11C 19/28; G11C 19/184

USPC ............... 345/98–100, 204, 212–213; 377/64
See application file for complete search history.

(56) References Cited

U.S. PATENT DOCUMENTS

2003/0231735 A1    12/2003   Moon et al.
2007/0146289 A1*    6/2007   Lee .................... G09G 3/3677
                                                        345/100

(Continued)

FOREIGN PATENT DOCUMENTS

JP       02-082295 A      3/1990
JP      2004-078172 A     3/2004

(Continued)

OTHER PUBLICATIONS

Official Communication issued in International Patent Application No. PCT/JP2011/058555, mailed on Jul. 12, 2011.

*Primary Examiner* — Matthew Fry
(74) *Attorney, Agent, or Firm* — Keating & Bennett, LLP

(57) ABSTRACT

A shift register 10 is configured such that m unit circuits 11 each including a shift unit 12 and three buffer units 13r, 13g, and 13b are in a multi-stage cascade connection and that 3m signals in total including three signals from each stage are outputted. The m shift units 12 perform a shift operation, and a first signal Y is outputted from each stage. When a clock signal CK is at a high level, the first signal Y rises higher than a normal high level due to bootstrapping. The buffer unit 13r controls an output signal YR to be at a high level based on the buffer control signal CR and the first signal Y. A buffer control circuit 7 controls buffer control signals CR, CG, and CB to be at a high level for a time period shorter than a half cycle of the clock signal. With this, a shift register with a reduced circuit amount and low power consumption is provided.

11 Claims, 17 Drawing Sheets

(56) References Cited

U.S. PATENT DOCUMENTS

| | | | |
|---|---|---|---|
| 2008/0055225 A1* | 3/2008 | Pak et al. | 345/96 |
| 2008/0080661 A1* | 4/2008 | Tobita | G11C 19/28 377/78 |
| 2008/0165112 A1* | 7/2008 | Su | G09G 3/3677 345/100 |
| 2008/0266275 A1* | 10/2008 | Tsai et al. | 345/204 |
| 2010/0085294 A1* | 4/2010 | Otose | 345/100 |
| 2010/0238156 A1* | 9/2010 | Iwamoto et al. | 345/213 |
| 2011/0058642 A1* | 3/2011 | Tsai | G09G 3/3677 377/79 |
| 2011/0134090 A1 | 6/2011 | Iwamoto et al. | |

FOREIGN PATENT DOCUMENTS

| | | |
|---|---|---|
| JP | 2008-140490 A | 6/2008 |
| JP | 2010-092545 A | 4/2010 |
| TW | 201040912 A * | 11/2010 |
| WO | 2010/050262 A1 | 5/2010 |

\* cited by examiner

SHIFT REGISTER AND DISPLAY DEVICE HAVING THE SAME

TECHNICAL FIELD

The present invention relates to shift registers and display devices, and in particular to a shift register suitably used for display devices and such, and a display device having a shift register.

BACKGROUND ART

An active matrix-type display device selects two-dimensionally arranged pixel circuits by row, and writes gradation voltages to the selected pixel circuits according to a video signal, thereby displaying an image. Such a display device is provided with a scanning signal line drive circuit including a shift register, in order to select the pixel circuits by row.

Further, as a method of downsizing display devices, there is known a method of monolithically forming a scanning signal line drive circuit on a display panel along with pixel circuits using a manufacturing process of forming TFTs (Thin Film Transistors) within the pixel circuits. Such a scanning signal line drive circuit is formed using an amorphous silicon TFT, for example. Alternatively, by using a TFT made of oxide semiconductor such as IGZO (Indium Gallium Zinc Oxide) in place of the amorphous silicon TFT, it is possible to configure a scanning signal line drive circuit capable of operating at a higher speed. A display panel having a scanning signal line drive circuit monolithically formed is also referred to as a gate driver monolithic panel.

As a shift register included in the scanning signal line drive circuit, various circuits have been known conventionally. For example, by connecting m unit circuits 111 shown in FIG. 18 in a multi-stage cascade connection, it is possible to configure a shift register having m stages. Further, Patent Document 1 describes a shift register having unit circuits 121 shown in FIG. 19 that are in a multi-stage cascade connection (see FIG. 20). This shift register is characterized in that each of the unit circuits 121 includes a carry buffer unit 122.

There is also known a method of driving a plurality of scanning signal lines in a single horizontal period as another method of downsizing and reducing power consumption of display devices. In the following, triple scanning for driving three scanning signal lines in a single horizontal period is described. A first method for realizing triple scanning is to provide the scanning signal line drive circuit with a shift register having stages of the same number as the number of the scanning signal lines. For example, one shift register having 3m stages is provided in order to drive 3m scanning signal lines. Further, a method of providing three separate shift registers is envisaged as a second method. Specifically, in order to drive 3m scanning signal lines, three shift registers each having m stages are provided and the three shift registers operate so as to delay by ⅓ horizontal period from each other.

Alternatively, a method in which a single shift register is provided for scanning signal lines, and an output from each stage of the shift register is supplied time-divisionally to three scanning signal lines is envisaged as a third method. FIG. 21 is a diagram illustrating a configuration of a conventional scanning signal line drive circuit using the third method. In FIG. 21, stage circuits 131 of a shift register are respectively associated with three scanning signal lines GLRi, GLGi, and GLBi. Each scanning signal line is provided with an analog switch 132 and a potential fixing circuit 133. Buffer control signals CR, CG, and CB are sequentially driven to a high level for ⅓ horizontal period. When the buffer control signal CR is at a low level, the potential fixing circuit 133 operates, and a low-level potential is fixedly applied to the scanning signal line GLRi. When the buffer control signal CR is at a high level, the potential fixing circuit 133 does not operate, and a signal outputted from each of the stage circuits 131 is applied to the scanning signal line GLRi via the analog switch 132.

In a display device that performs triple scanning, the number of data signal lines provided in a pixel region is reduced to one third, and the number of the output terminals of the data signal line drive circuit is also reduced to one third, as compared to a display device that does not perform triple scanning. With this, it is possible to reduce a circuit amount of a data signal line drive circuit, as well as to reduce power consumption of the display device.

PRIOR ART DOCUMENT

Patent Document

[Patent Document 1] Japanese Laid-Open Patent Publication No. 2004-78172

SUMMARY OF THE INVENTION

Problems to be Solved by the Invention

By combining the two techniques described above, it is aimed to monolithically form a scanning signal line drive circuit capable of performing triple scanning on a display panel. When the triple scanning is realized by the first or the second method described above, it is necessary to dispose circuits of 3m stages in a picture-frame portion of a display panel (a portion around the pixel region) in order to drive 3m scanning signal lines, and therefore an area of the picture-frame portion increases. In addition, as the circuits of 3m stages operate, power consumption of the scanning signal line drive circuit increases. Therefore, it is preferable to use the third method described above when realizing triple scanning. Further, when the scanning signal line drive circuit is monolithically formed on a display panel, it is preferable to use TFTs of the same channel type in order to reduce costs.

However, when the scanning signal line drive circuit illustrated in FIG. 21 is configured by using TFTs of the same channel type, it is required to apply a potential that is higher than a potential applied to the scanning signal lines to a gate of the analog switch 132 in order to turn the analog switch 132 to an ON state. Therefore, it is necessary to newly provide a power supply circuit for generating this potential. There is also a problem that reliability of the circuit is reduced due to a voltage stress from the potential fixing circuit 133.

Thus, an object of the present invention is to provide a shift register having a suitable configuration for being monolithically formed on a display panel, with a smaller circuit amount and lower power consumption.

Means for Solving the Problems

According to a first aspect of the present invention, there is provided a shift register configured such that a plurality of unit circuits are in a multi-stage cascade connection and capable of outputting one or more signals from each stage according to a buffer control signal, wherein each of the unit circuits includes a shift unit and one or more buffer units controlled by the buffer control signal, the shift unit includes: a first transistor configured to apply an ON potential to a first node according to a set signal; a second transistor configured to apply an OFF potential to the first node according to a reset signal; a third transistor provided between an input node for a clock signal and a second node, and having a control terminal connected to the first node; and a fourth transistor configured to apply an OFF potential to the second node according to the reset signal, and the buffer unit includes: an output node; a fifth transistor configured to apply an ON potential to the output node based on a potential at the first node and the buffer control signal; and a sixth transistor configured to apply an OFF potential to the output node according to the reset signal.

According to a second aspect of the present invention, in the first aspect of the present invention, the fifth transistor is provided between an input node for the buffer control signal and the output node, and has a control terminal connected to the first node.

According to a third aspect of the present invention, in the second aspect of the present invention, the shift unit further includes a capacitance between the first node and the second node.

According to a fourth aspect of the present invention, in the third aspect of the present invention, the buffer unit further includes a capacitance between the first node and the output node.

According to a fifth aspect of the present invention, in the first aspect of the present invention, each of the unit circuits includes a plurality of the buffer units.

According to a sixth aspect of the present invention, in the fifth aspect of the present invention, the shift register further includes: a buffer control circuit configured to control a plurality of buffer control signals to be at an ON level for a time period shorter than a half cycle of the clock signal.

According to a seventh aspect of the present invention, in the sixth aspect of the present invention, the buffer control circuit controls the buffer control signals to be at an ON level respectively for periods not overlapping with each other.

According to an eighth aspect of the present invention, in the sixth aspect of the present invention, the buffer control circuit controls the buffer control signals to be at an ON level at a same timing.

According to a ninth aspect of the present invention, in the sixth aspect of the present invention, the buffer control circuit controls the buffer control signals to be at an OFF level before the clock signal changes to an OFF level.

According to a tenth aspect of the present invention, in the sixth aspect of the present invention, the buffer control circuit has a function for fixing the buffer control signals to an OFF level during a specified period.

According to an eleventh aspect of the present invention, in the sixth aspect of the present invention, the buffer control circuit has a function for controlling the buffer control signals to be at an ON level respectively during periods different from each other, and a function for controlling the buffer control signals to be at an ON level during a same period.

According to a twelfth aspect of the present invention, in the first aspect of the present invention, the shift unit further includes a circuit for applying an OFF potential to the first node according to a signal other than the reset signal.

According to a thirteenth aspect of the present invention, in the first aspect of the present invention, the shift unit further includes a transistor for applying an OFF potential to the second node according to a signal other than the reset signal.

According to a fourteenth aspect of the present invention, in the first aspect of the present invention, the buffer unit further includes a transistor for applying an OFF potential to the output node according to a signal other than the reset signal.

According to a fifteenth aspect of the present invention, in the first aspect of the present invention, the shift unit further includes a transistor for applying an OFF potential to the first node according to a clear signal.

According to a sixteenth aspect of the present invention, in the first aspect of the present invention, the shift unit further includes: a seventh transistor provided between a power supply node having an ON potential and a third node, and having a control terminal connected to the first node; and an eighth transistor provided between a power supply node having an OFF potential and the third node, and having a control terminal to which the reset signal is supplied.

According to a seventeenth aspect of the present invention, there is provided a display device, including: a display panel including a pixel region in which a plurality of scanning signal lines are provided; and a scanning signal line drive circuit including a shift register according to one of the first to sixteenth aspects of the present invention, and monolithically formed on the display panel.

Effects of the Invention

According to the first aspect of the present invention, by providing each stage with the shift unit and the one or more buffer units, and by outputting, from the buffer unit(s), the signal(s) changing based on the potential at the first node in the shift unit, the buffer control signal(s), and the reset signal, it is possible to configure the shift register that outputs one or more signals from each stage according to the buffer control signal(s). When a shift register that outputs a plurality of signals from each stage is configured in this manner, a circuit amount and power consumption of such a shift register become smaller than those of a shift register that outputs a single signal from each stage. By monolithically forming a scanning signal line drive circuit including this shift register on a display panel, it is possible to reduce an area of a picture-frame portion of the display panel and power consumption of the display device.

According to the second aspect of the present invention, by providing the transistor between the input node for the buffer control signal and the output node such that the control terminal of this transistor is connected to the first node, it is possible to configure the buffer unit that applies an ON potential to the output node based on the potential at the first node in the shift unit and the buffer control signal. By providing each stage with one or more of such buffer units, it is possible to configure a shift register that outputs one or more signals from each stage.

According to the third aspect of the present invention, by providing the capacitance between the first node and the second node, when the clock signal becomes an ON level, it is possible to supply the first node with a sufficient ON potential by bootstrapping, thereby preventing the clock signal passing through the third transistor from being distorted.

According to the fourth aspect of the present invention, by providing the capacitance between the first node and the output node, when the buffer control signal becomes an ON level, it is possible to supply the first node with a sufficient ON potential by bootstrapping, thereby preventing the buffer control signal passing through the fifth transistor from being distorted.

According to the fifth aspect of the present invention, by providing each stage with the shift unit and the plurality of buffer units, and by outputting, from the buffer units, the signals changing based on a potential at the first node in the shift unit, the buffer control signals, and the reset signal, it is possible to configure the shift register that outputs a plurality of signals from each stage according to the buffer control signals. A circuit amount and power consumption of such a shift register are smaller than those of a shift register that outputs a single signal from each stage. By monolithically forming a scanning signal line drive circuit including this shift register on a display panel, it is possible to reduce an area of a picture-frame portion of the display panel and power consumption of the display device.

According to the sixth aspect of the present invention, by controlling the plurality of buffer control signals to be at an ON level for a time period shorter than the half cycle of the clock signal using the buffer control circuit, it is possible to output, from the buffer unit, signals that are turned to an ON level for a time period shorter than the half cycle of the clock signal.

According to the seventh aspect of the present invention, by controlling the buffer control signals to be at an ON level respectively for periods not overlapping with each other using the buffer control circuit, it is possible to output, from the respective buffer units, signals that are turned to an ON level respectively for periods not overlapping with each other.

According to the eighth aspect of the present invention, by controlling the buffer control signals to be at an ON level at the same timing using the buffer control circuit, it is possible to largely change the potential at the first node, to increase the driving capabilities of the fifth transistor, and to change the signals outputted from the respective buffer units to an ON level in a short time.

According to the ninth aspect of the present invention, by controlling the buffer control signals to be at an OFF level before the clock signal changes to an OFF level using the buffer control circuit, it is possible to control the buffer control signals to be at an OFF level while applying a sufficient ON potential to the first node, and to change the signals outputted from the respective buffer units to an OFF level in a short time.

According to the tenth aspect of the present invention, by providing the buffer control circuit having the function for fixing the buffer control signals to an OFF level during the specified period, it is possible to configure a shift register suitable for a scanning signal line drive circuit of a display device capable of performing partial driving. By performing partial driving in the display device, it is possible to cause the drive circuits of the display panel to operate partially, thereby reducing power consumption.

According to the eleventh aspect of the present invention, by providing the buffer control circuit having the function for controlling the buffer control signals to be at an ON level during the periods different from each other and the function for controlling the buffer control signals to be at an ON level during the same period, it is possible to configure a shift register suitable for a scanning signal line drive circuit of a display device capable of switching between color display and monochrome display. By employing monochrome display in the display device, it is possible to reduce the number of times for charge and discharge of the data signal lines, thereby reducing power consumption.

According to the twelfth aspect of the present invention, by providing the shift unit with the circuit for applying an OFF potential to the first node according to the signal other than the reset signal, it is possible to surely control the potential at the first node to be at an OFF level, thereby preventing malfunction of the shift register.

According to the thirteenth aspect of the present invention, by providing the shift unit with the transistor for applying an OFF potential to the second node according to the signal other than the reset signal, it is possible to surely control the potential at the second node to be at an OFF level, thereby preventing malfunction of the shift register.

According to the fourteenth aspect of the present invention, by providing the buffer unit with the transistor for applying an OFF potential to the output node according to the signal other than the reset signal, it is possible to surely control the signal outputted from the buffer unit to be at an OFF level, thereby preventing malfunction of the shift register.

According to the fifteenth aspect of the present invention, by providing the shift unit with the transistor for applying an OFF potential to the first node according to the clear signal, it is possible to surely control the potential at the first node to be at an OFF level when clearing, thereby stabilizing an initial operation of the shift register.

According to the sixteenth aspect of the present invention, by providing the shift unit with the two transistors that are connected to the power supply nodes, it is possible to apply, to the third node, an ON potential and an OFF potential that are supplied from the power source. Therefore, by supplying the signal outputted from the third node to the previous-stage unit circuit and the subsequent-stage unit circuit, it is possible to prevent malfunction of the shift register.

According to the seventeenth aspect of the present invention, by monolithically forming the scanning signal line drive circuit including the shift register with a reduced circuit amount and low power consumption on the display panel, it is possible to configure the display device with a reduced area of the picture-frame portion of the display panel and low power consumption.

MODES FOR CARRYING OUT THE INVENTION

Figure 1:
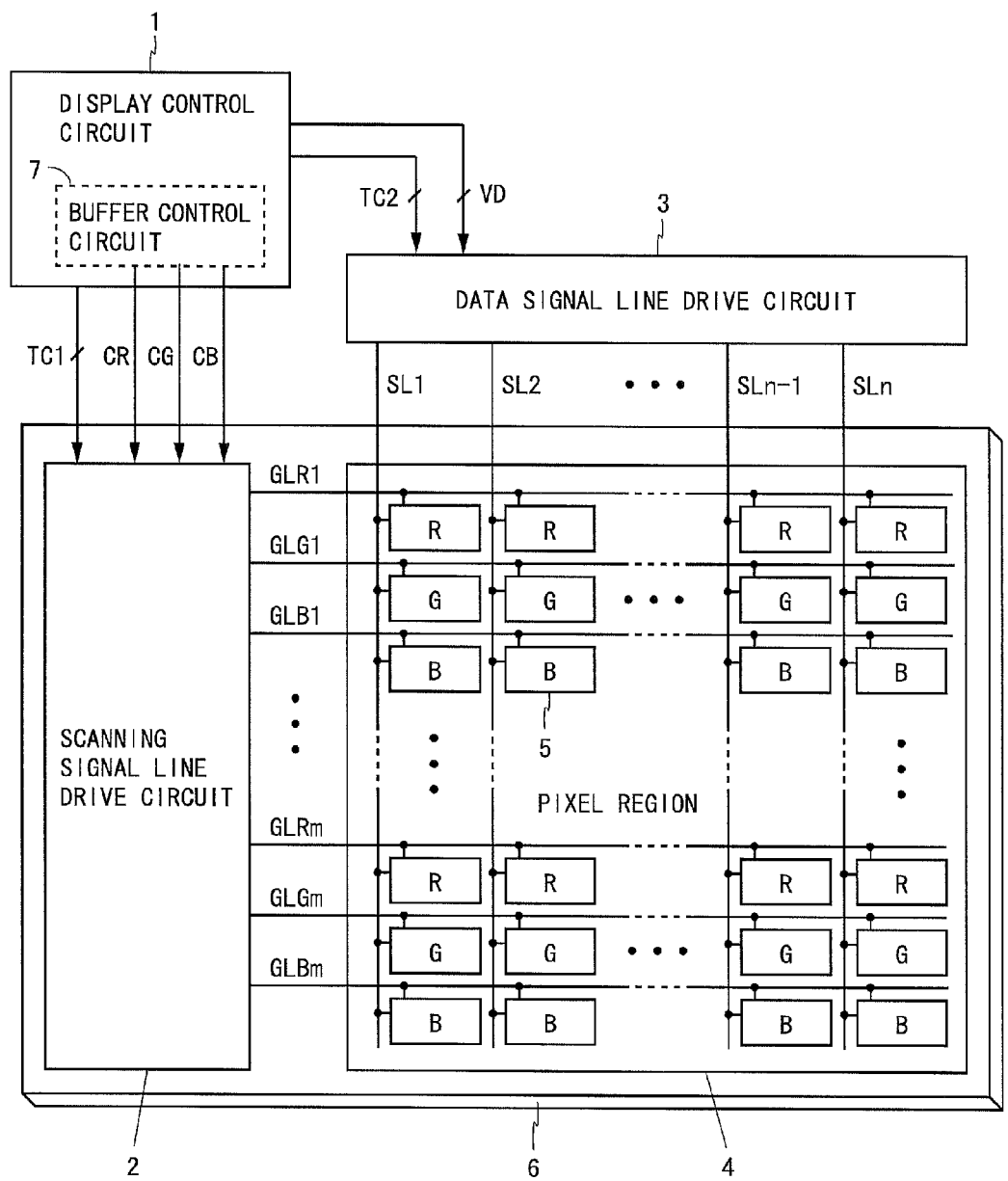
FIG. 1 is a block diagram illustrating a configuration of a liquid crystal display device according to embodiments of the present invention.

FIG. 1 is a block diagram illustrating a configuration of a liquid crystal display device according to embodiments of the present invention. The liquid crystal display device shown in FIG. 1 is provided with a display control circuit 1, a scanning signal line drive circuit 2, a data signal line drive circuit 3, and a pixel region 4. The pixel region 4 includes a plurality of pixel circuits 5 that are arranged two-dimensionally, and is formed on a liquid crystal panel 6. The scanning signal line drive circuit 2 is monolithically formed on the liquid crystal panel 6 along with the pixel circuits 5. The scanning signal line drive circuit 2 is formed by using a TFT made of oxide semiconductor such as IGZO, for example. Here, all or a part of the display control circuit 1 and the data signal line drive circuit 3 may be monolithically formed on the liquid crystal panel 6. Hereinafter, it is assumed that m and n are an integer not smaller than 2, i is an integer not smaller than 1 and not greater than m.

The pixel region 4 includes 3m scanning signal lines GLR1 to GLRm, GLG1 to GLGm, and GLB1 to GLBm, n data signal lines SL1 to SLn, and (3m×n) pixel circuits 5. The 3m scanning signal lines are provided in parallel with each other, and the n data signal lines are provided in parallel with each other so as to intersect perpendicularly with the scanning signal lines. The (3m×n) pixel circuits 5 are respectively provided in the vicinity of intersections between the 3m scanning signal lines and the n data signal lines. Each of the pixel circuits 5 functions as a single sub-pixel. The pixel circuits 5 in (3i−2)-th row are connected to the scanning signal line GLRi and function as red sub-pixels. The pixel circuits 5 in (3i−1)-th row are connected to the scanning signal line GLGi and function as green sub-pixels. The pixel circuits 5 in 3i-th row are connected to the scanning signal line GLBi and function as blue sub-pixels. Three sub-pixels aligning along a direction in which the data signal lines extend constitute a single color pixel.

The display control circuit 1 outputs a timing control signal TC1 to the scanning signal line drive circuit 2 and a timing control signal TC2 and a video signal VD to the data signal line drive circuit 3. The timing control signal TC1 includes a gate start pulse GSP, a gate end pulse GEP, and gate clocks GCK1 and GCK2 of two phases. The timing control signal TC2 includes a source start pulse, a source clock, and a latch pulse. The display control circuit 1 includes a buffer control circuit 7 configured to output buffer control signals CR, CG, and CB to the scanning signal line drive circuit 2. The scanning signal line drive circuit 2 drives the 3m scanning signal lines based on the timing control signal TC1 and the buffer control signals CR, CG, and CB. The data signal line drive circuit 3 applies potentials corresponding to the video signal VD to the n data signal lines based on the timing control signal TC2.

The scanning signal line drive circuit 2 includes a shift register configured such that m unit circuits are in a multi-stage cascade connection and capable of outputting 3m signals in total including three signals from each stage according to the buffer control signals CR, CG, and CB. The liquid crystal display device shown in FIG. 1 is characterized by a circuit configuration and a control method of the shift register included in the scanning signal line drive circuit 2. Thus, the following describes the shift register in detail. Here, in addition to a circuit configured by the m unit circuits, a circuit configured by the m unit circuits and the buffer control circuit 7 is also referred to as the shift register.

(First Embodiment)

Figure 2:
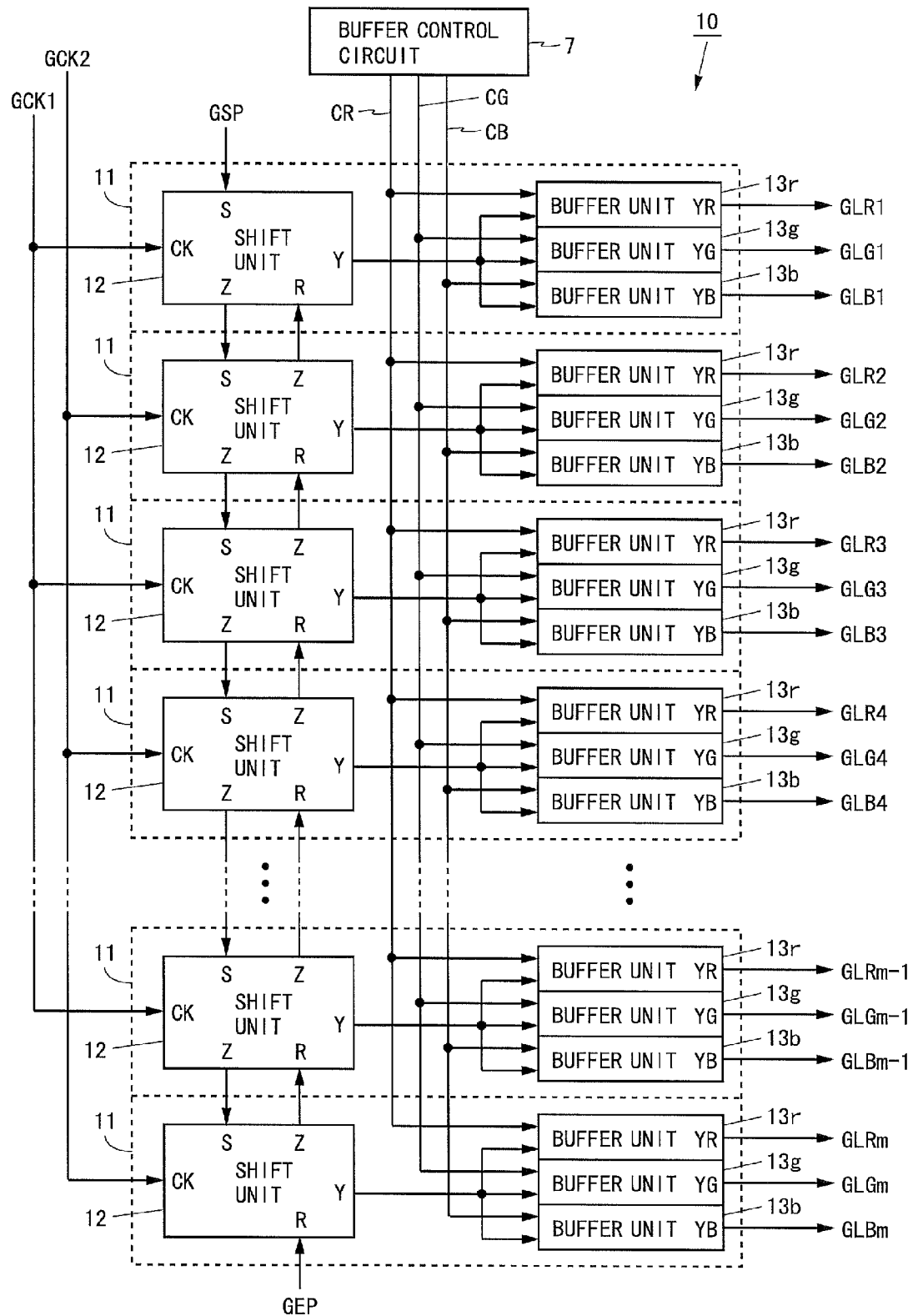
FIG. 2 is a block diagram illustrating a configuration of a shift register according to a first embodiment of the present invention.

FIG. 2 is a block diagram illustrating a configuration of a shift register according to a first embodiment of the present invention. A shift register 10 shown in FIG. 2 is configured such that m unit circuits 11 are in a multi-stage cascade connection. Each of the unit circuits 11 includes a shift unit 12 and three buffer units 13r, 13g, and 13b. The shift register 10 is supplied with the gate start pulse GSP, the gate end pulse GEP, and the gate clocks GCK1 and GCK2 of two phases from the display control circuit 1. Further, the shift register 10 is supplied with the buffer control signals CR, CG, and CB from the buffer control circuit 7.

The m shift units 12 are in a multi-stage cascade connection. The m shift units 12 in a multi-stage cascade connection perform a shift operation, and a first signal Y is outputted from each stage. More specifically, a clock signal CK, a set signal S, and a reset signal R are inputted to each of the shift units 12, and the first signal Y and a second signal Z are outputted from each of the shift units 12. To the shift unit 12 in an odd-numbered stage, the gate clock GCK1 is inputted as the clock signal CK. To the shift unit 12 in an even-numbered stage, the gate clock GCK2 is inputted as the clock signal CK. To the shift unit 12 in a first stage, the gate start pulse GSP is inputted as the set signal S. To the shift unit 12 in a stage other than the first stage, the second signal Z outputted from the shift unit 12 in a previous stage is inputted as the set signal S. To the shift unit 12 in an m-th stage, the gate end pulse GEP is inputted as the reset signal R. To the shift unit 12 in a stage other than the m-th stage, the second signal Z outputted from the shift unit 12 in a next stage is inputted as the reset signal R.

The m buffer units 13r are supplied with the buffer control signal CR, the m buffer unit 13g are supplied with the buffer control signal CG, and the m buffer unit 13b are supplied with the buffer control signal CB. Each of the buffer units 13r outputs an output signal YR based on the buffer control signal CR, the first signal Y (the first signal Y outputted from the shift unit 12 in the same unit circuit 11), and the reset signal R. Likewise, the buffer unit 13g outputs an output signal YG based on the buffer control signal CG, the first signal Y, and the reset signal R, and the buffer unit 13b outputs an output signal YB based on the buffer control signal CB, the first signal Y, and the reset signal R. To the scanning signal lines GLRi, GLGi, and GLBi, the output signals YR, YG, and YB from the unit circuit 11 in an i-th stage are respectively applied. As described above, the shift register 10 is configured such that the m unit circuits 11 are in a multi-stage cascade connection, and capable of outputting the three output signals YR, YG, and YB from each stage according to the three buffer control signals CR, CG, and CB.

Figure 3:
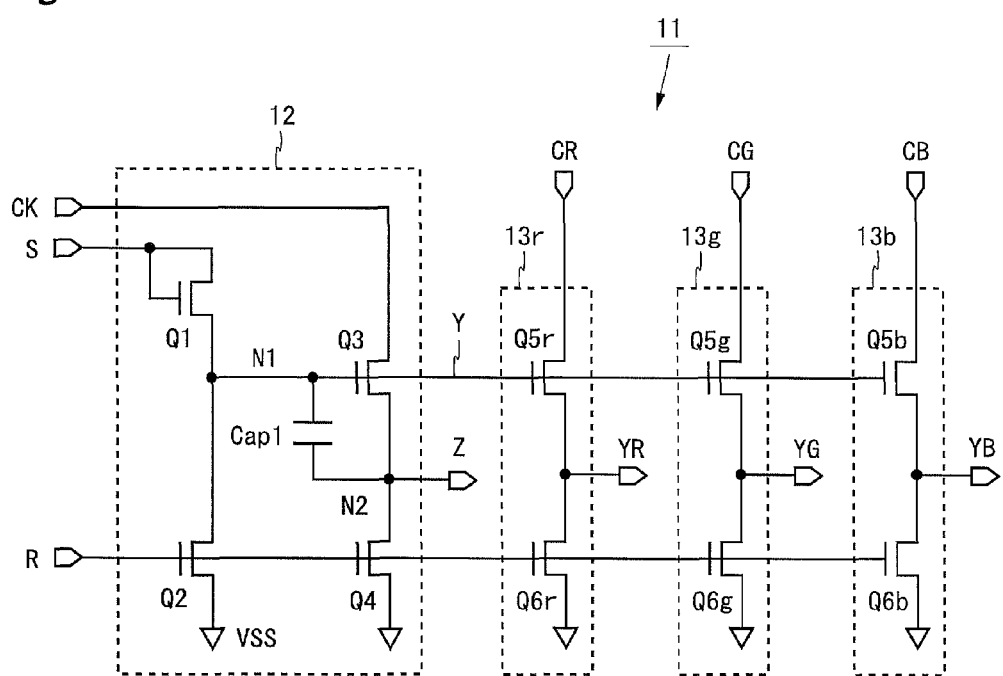
FIG. 3 is a circuit diagram of a unit circuit of the shift register shown in FIG. 2.

FIG. 3 is a circuit diagram of the unit circuit 11. As illustrated in FIG. 3, the shift unit 12 includes TFTs Q1 to Q4 and a capacitor Cap1. The buffer unit 13r includes TFTs Q5r and Q6r, the buffer unit 13g includes TFTs Q5g and Q6g, and the buffer unit 13b includes TFTs Q5b and Q6b. All of the TFTs included in the unit circuit 11 are of an N-channel type. In an N-channel type TFT, a high-level potential is an ON potential, and a low-level potential is an OFF potential. In addition, a high-level signal corresponds to an ON state, and a low-level signal corresponds to an OFF state.

In the shift unit 12, a source of the TFT Q1, a drain of the TFT Q2, a gate of the TFT Q3, and one electrode of the capacitor Cap1 are connected to a node N1. A source of the TFT Q3, a drain of the TFT Q4, and the other electrode of the capacitor Cap1 are connected to a node N2. To a drain and a gate of the TFT Q1, the set signal S is supplied. To a drain of the TFT Q3, the clock signal CK is supplied. To gates of the TFTs Q2 and Q4, the reset signal R is supplied. To sources of the TFTs Q2 and Q4, a low-level supply potential VSS is supplied. The first signal Y is outputted through the node N1, and the second signal Z is outputted through the node N2.

In the buffer unit 13r, a source of the TFT Q5r and a drain of the TFT Q6r are connected to a first output node. In the buffer unit 13g, a source of the TFT Q5g and a drain of the TFT Q6g are connected to a second output node. In the buffer unit 13b, a source of the TFT Q5b and a drain of the TFT Q6b are connected to a third output node. To drains of the TFTs Q5r, Q5g, and Q5b, the buffer control signals CR, CG, and CB are respectively supplied. Gates of the TFTs Q5r, Q5g, and Q5b are connected to the node N1. To gates of the TFTs Q6r, Q6g, and Q6b, the reset signal R is supplied. To sources of the TFTs Q6r, Q6g, and Q6b, the low-level supply potential VSS is supplied. The output signals YR, YG, and YB are outputted through the first to third output nodes, respectively.

The buffer control circuit 7 controls the buffer control signals CR, CG, and CB to be at a high level for a time period that is shorter than a half cycle of the clock signal supplied to the shift unit 12. As described hereinafter, the buffer control circuit 7 according to this embodiment controls the buffer control signals CR, CG, and CB to be at a high level respectively for periods not overlapping with each other.

Figure 4:
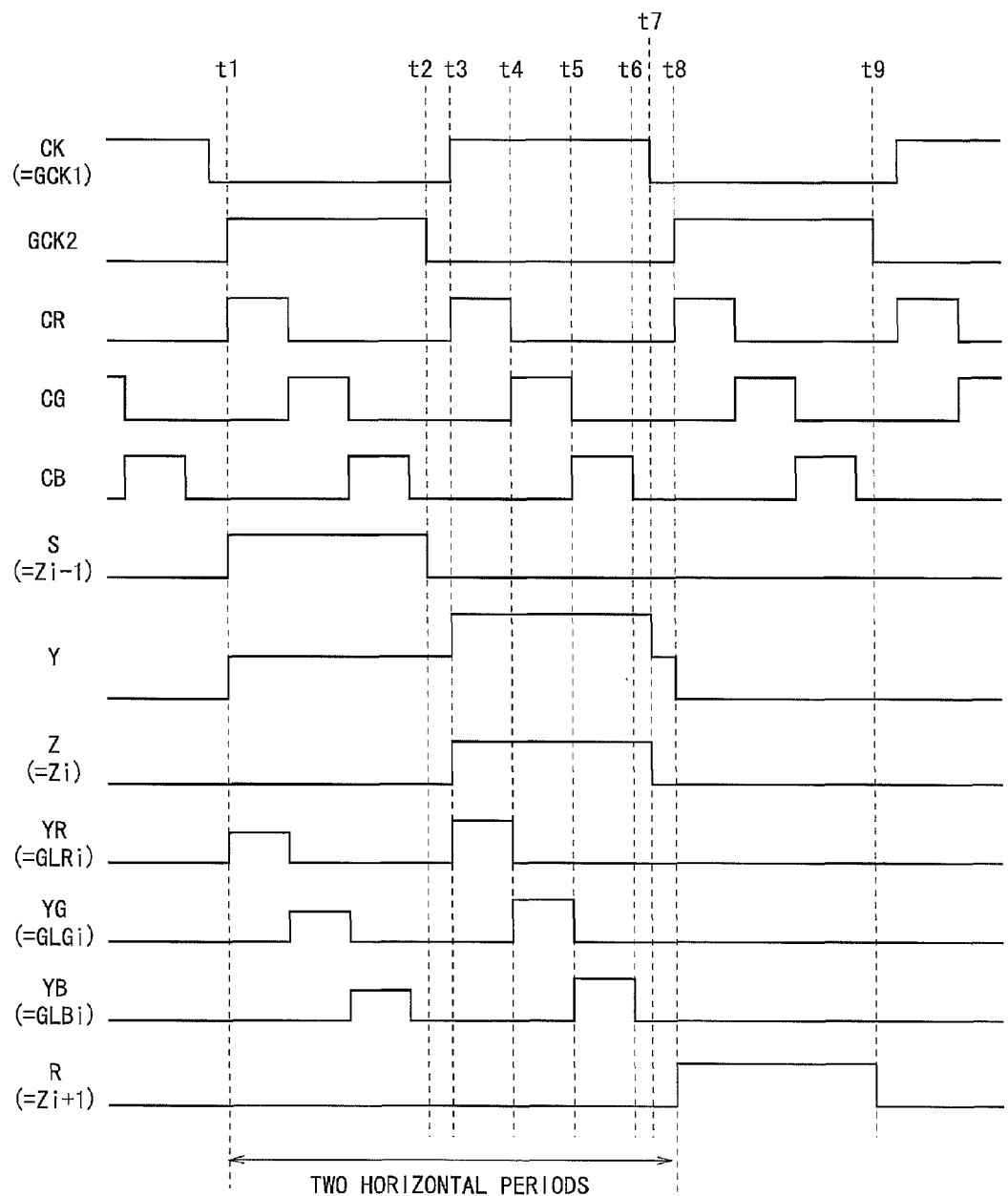
FIG. 4 is a timing chart of the shift register shown in FIG. 2.

FIG. 4 is a timing chart of the shift register 10. As illustrated in FIG. 4, the gate clock GCK1 is a clock signal whose cycle is two horizontal periods. However, a high-level period of the gate clock GCK1 is shorter than a low-level period of the gate clock GCK1. The gate clock GCK2 is a signal obtained by delaying the gate clock GCK1 by a single horizontal period. The buffer control signals CR, CG, and CB are sequentially turned to a high level respectively for periods not overlapping with each other within a single horizontal period. The length of periods during which the buffer control signals CR, CG, and CB are turned to a high level, respectively, is substantially ⅓ of a single horizontal period.

At time t1, when the set signal S (a second signal Zi−1 outputted from the previous-stage shift unit 12) changes to a high level, the TFT Q1 is turned to the ON state, and a potential at the node N1 (the first signal Y) becomes a high level. With this, the TFTs Q3, Q5r, Q5g, and Q5b are turned to the ON state. Then, at time t2, when the set signal S changes to a low level, the TFT Q1 is turned to the OFF state and the node N1 becomes a high impedance state.

Next, at time t3, the clock signal CK (the gate clock GCK1) changes to a high level. As the TFT Q3 is in the ON state at this time, a potential at the node N2 (the second signal Z) becomes a high level as the clock signal CK changes. Further, the capacitor Cap1 is provided between the node N1 and the node N2, and a potential difference held in the capacitor Cap1 hardly changes before and after time t3. Therefore, when the potential at the node N2 changes from a low level to a high level, the potential at the node N1 changes by the same amount, and rises higher than a normal high level (bootstrap). This state continues until time t7 at which the clock signal CK changes to a low level.

The buffer control signal CR is at a high level from time t3 to time t4, the buffer control signal CG is at a high level from time t4 to time t5, and the buffer control signal CB is at a high level from time t5 to time t6. During these periods, the TFTs Q5r, Q5g, and Q5b are in the ON state. Therefore, the output signal YR is at a high level from time t3 to time t4, the output signal YG is at a high level from time t4 to time t5, and the output signal YB is at a high level from time t5 to time t6. Then, at time t7, when the clock signal CK changes to a low level, the potential at the node N2 becomes a low level and the potential at the node N1 becomes the normal high level.

Next, at time t8, when the reset signal R (a second signal Zi+1 outputted from the subsequent-stage shift unit 12) changes to a high level, the TFTs Q2, Q4, Q6r, Q6g, and Q6b are turned to the ON state. When the TFT Q2 is turned to the ON state, the potential at the node N1 becomes a low level and the TFTs Q3, Q5r, Q5g, and Q5b are turned to the OFF state. When the TFT Q4 is turned to the ON state, the low-level supply potential VSS is applied to the node N2. When TFTs Q6r, Q6g, and Q6b are turned to the ON state, the low-level supply potential VSS is applied to all of the first to third output nodes. Then, at time t9, when the reset signal R changes to a low level, the TFTs Q2, Q4, Q6r, Q6g, and Q6b are turned to the OFF state.

Here, from time t1 to time t2, the potential at the node N1 is at a high level. Therefore, when the buffer control signal CR changes to a high level during this period, the output signal YR changes to a high level. However, during this period, as the potential at the node N1 is at the normal high level, the output signal YR drops lower than the normal high level due to a voltage drop in the TFT Q5r. When the output signal YR changes to a high level twice in two consecutive horizontal periods in this manner, there is a case in which writing to the pixel circuit 5 is performed twice successively. When writing to the pixel circuit 5 is performed twice successively, the latter writing becomes effective. Therefore, even if the output signal YR becomes a high level twice in two consecutive horizontal periods, there is no problem in an operation of the display device. This also applies to the output signals YG and YB.

As described above, the TFT Q1 functions as a first transistor that applies a high-level potential to the node N1 according to the set signal S. The TFT Q2 functions as a second transistor that applies a low-level potential to the node N1 according to the reset signal R. The TFT Q3 functions as a third transistor provided between an input node for the clock signal CK and the node N2 and having a control terminal connected to the node N1. The TFT Q4 functions as a fourth transistor that applies a low-level potential to the node N2 according to the reset signal R. The TFT Q5r functions as a fifth transistor that applies a high-level potential to the first output node based on the potential at the node N1 and the buffer control signal CR. Likewise, the TFTs Q5g and Q5b also function as the fifth transistor. The TFT Q6r functions as a sixth transistor that applies a low-level potential to the first output node according to the reset signal R. Likewise, the TFTs Q6g and Q6b also function as the sixth transistor.

Figure 18:
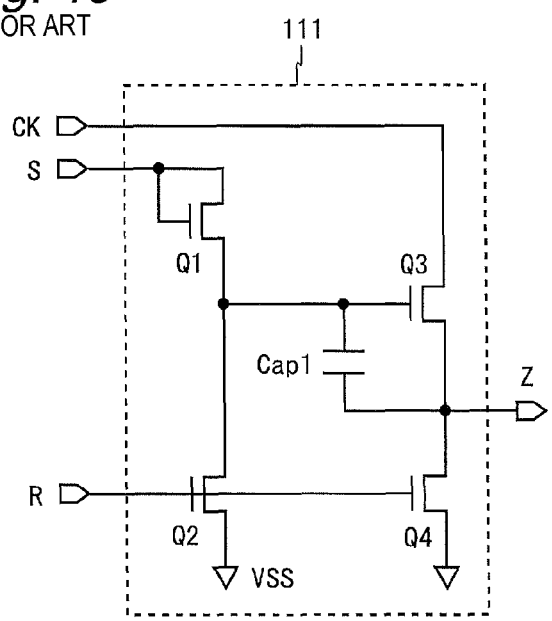
FIG. 18 is a circuit diagram of a unit circuit included in a conventional shift register.
Figure 19:
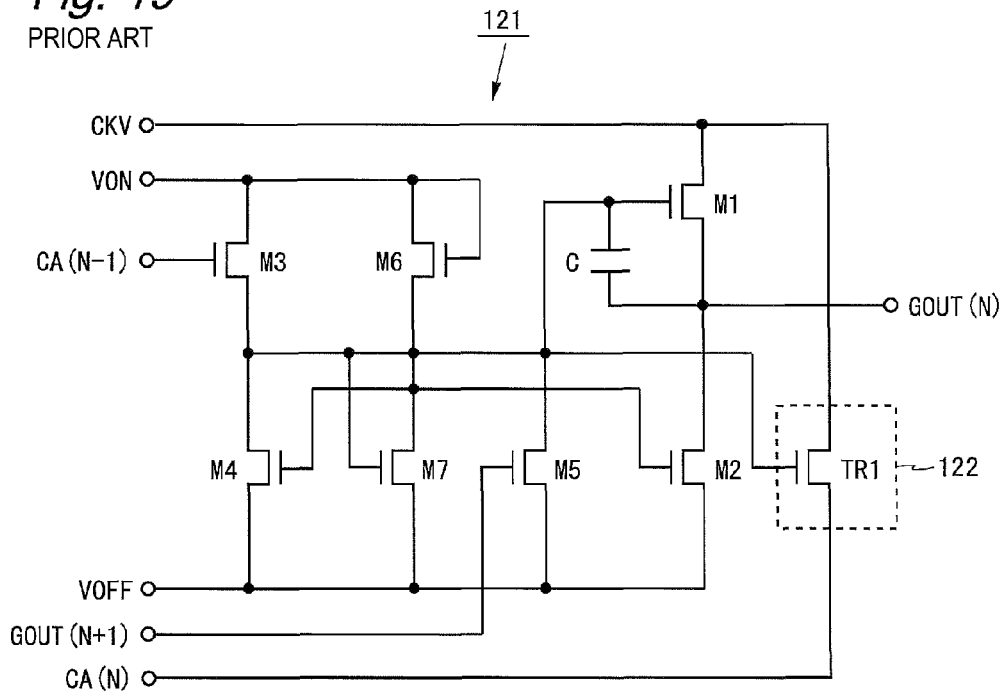
FIG. 19 is a circuit diagram of a unit circuit included in a conventional shift register.
Figure 20:
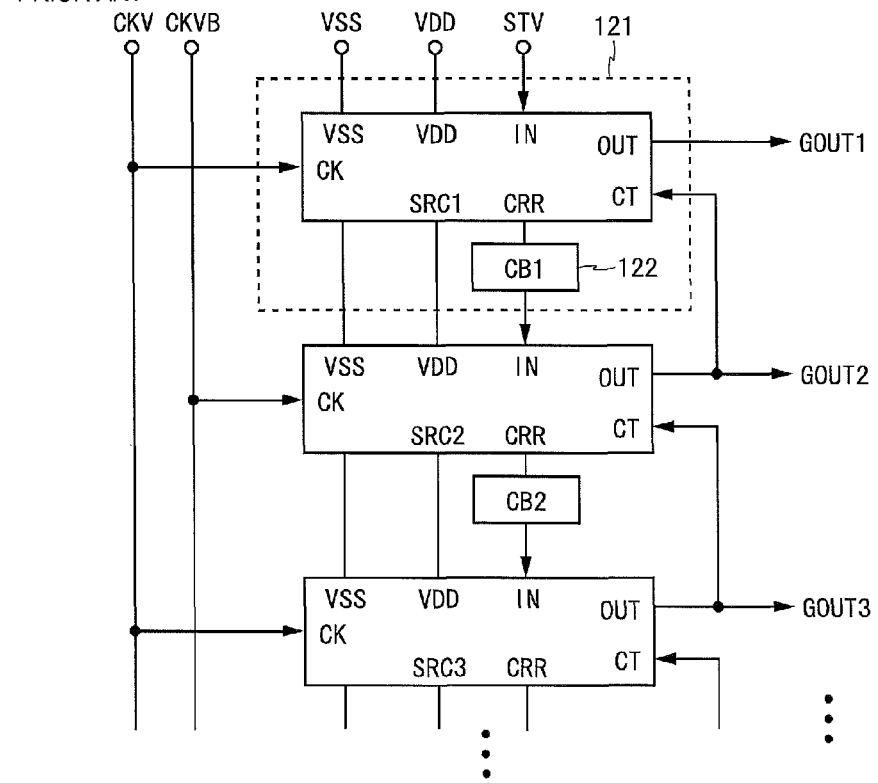
FIG. 20 is a block diagram illustrating a connection form of the unit circuit shown in FIG. 19.

Now, effects of the shift register 10 according to this embodiment will be described in contrast with a shift register configured such that unit circuits 111 illustrated in FIG. 18 are in a multi-stage cascade connection and that outputs a single signal from each stage (hereinafter referred to as a conventional shift register). In order to drive 3m scanning signal lines using the conventional shift register, the number of the unit circuits 111 required is 3m. Each of the unit circuits 111 includes four TFTs and one capacitor. Therefore, the conventional shift register that drives the 3m scanning signal lines includes 12m TFTs and 3m capacitors.

On the other hand, in order to drive 3m scanning signal lines using the shift register 10 according to this embodiment, the number of the unit circuits 11 required is m. Each of the unit circuits 11 includes ten TFTs and one capacitor. Therefore, the shift register 10 that drives the 3m scanning signal lines includes 10m TFTs and m capacitors. As described above, according to the shift register 10 of this embodiment, it is possible to reduce the circuit amount as compared to the conventional shift register.

Further, a case in which a scanning signal line drive circuit having a shift register is monolithically formed on a liquid crystal panel is considered. In this case, in order to supply the gate clocks GCK1 and GCK2 to each unit circuit, it is necessary to provide two gate clock lines along one side of the liquid crystal panel. Where an operating frequency is f, a load capacitance per gate clock line (including a wiring capacitance and a TFT load capacitance) is C, a signal amplitude voltage is V in the conventional shift register, the power consumption P1 of the conventional shift register is given by an expression (1) shown below.

$$P1 = 2 \cdot f \cdot C \cdot V^2 \qquad (1)$$

For the shift register 10 according to this embodiment, it is necessary to provide three control lines for supplying the buffer control signals CR, CG, and CB, in addition to the two gate clock lines. According to this embodiment, frequencies of the gate clocks GCK1 and GCK2 are reduced to one third of that of the conventional configuration, and the number of TFTs connected to a single gate clock line is reduced to one third of that of the conventional configuration. Assuming that the wiring capacitance is sufficiently smaller as compared to the TFT load capacitance, the load capacitance per gate clock line is reduced to one third of that of the conventional configuration. Frequencies of the buffer control signals CR, CG, and CB are twice as high as those of the gate clocks GCK1 and GCK2. Further, the number of TFTs connected to a single control line is twice as many as that for the gate clock line. Therefore, power consumption P2 of the shift register 10 according to this embodiment is given by an expression (2) shown below. As described above, according to the shift register 10 of this embodiment, it is possible to reduce the power consumption by about 22% as compared to the conventional shift register.

$$P2 = 2 \cdot (1/3)f \cdot (1/3)C \cdot V^2 + 3 \cdot (2/3)f \cdot (2/3)C \cdot V^2 \qquad (2)$$
$$= (14/9) \cdot f \cdot C \cdot V^2$$

Further, according to the shift register 10 of this embodiment, it is possible to reduce the size of the TFT Q3, as the TFT Q3 does not drive the scanning signal lines. For example, if the size of the TFT Q3 is reduced to one fifth of that of the conventional configuration, the load capacitance of the two gate clock lines is reduced to one fifth of that described in the above. Therefore, power consumption P3 in this case is given by an expression (3) shown below. When the size of the TFT Q3 is reduced to one fifth in this manner, it is possible to reduce the power consumption by about 31% as compared to the conventional shift register.

$$P3 = 2 \cdot (1/3)f \cdot (1/3) \cdot (1/5)C \cdot V^2 + 3 \cdot (2/3)f \cdot (2/3)C \cdot V^2 \qquad (3)$$
$$= (62/45) \cdot f \cdot C \cdot V^2$$

Figure 21:
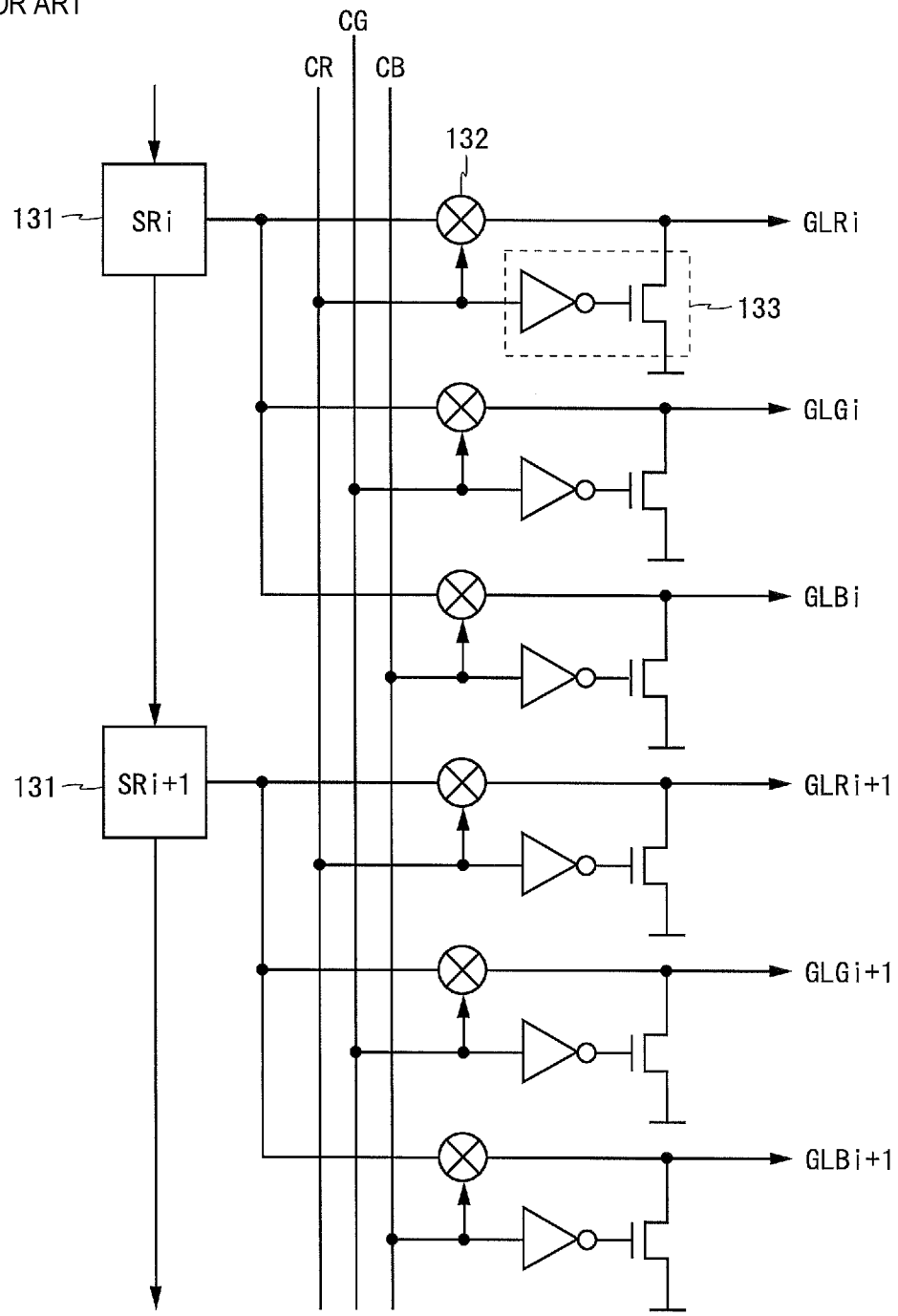
FIG. 21 is a diagram illustrating a configuration of a conventional scanning signal line drive circuit capable of performing triple scanning.

Moreover, unlike a scanning signal line drive circuit illustrated in FIG. 21, the shift register 10 according to this embodiment does not include a potential fixing circuit. Therefore, reliability of the circuit is not reduced due to a voltage stress from the potential fixing circuit. In addition, it is not necessary to newly provide a power supply circuit for generating a potential to be applied to a gate of an analog switch.

As described above, according to the shift register 10 of this embodiment, by providing each stage with the shift unit 12 and the plurality of buffer units 13r, 13g, and 13b and by outputting, from the buffer units 13r, 13g, and 13b, the output signals YR, YG, and YB that change based on the potential at the node N1 in the shift unit 12, the buffer control signals CR, CG, and CB, and the reset signal R, it is possible to configure the shift register that outputs 3m signals in total including three signals from each stage. In particular, by providing the TFTs Q5r, Q5g, and Q5b respectively between the input nodes for the buffer control signals CR, CG, and CB and the first to third output nodes such that the gate of the three TFTs are connected to the node N1, it is possible to configure the buffer units 13r, 13g, and 13b that respectively apply a high-level potential to the first to third output nodes based on the potential at the node N1 in the shift unit 12 and the buffer control signals CR, CG, and CB. The circuit amount and the power consumption of the shift register 10 thus configured are smaller than those of a shift register that outputs a single signal from each stage. In addition, by monolithically forming a scanning signal line drive circuit including the shift register 10 on a liquid crystal panel, it is possible to reduce an area of a picture-frame portion of the liquid crystal panel and the power consumption of the liquid crystal display device.

Furthermore, by providing the capacitor Cap1 between the node N1 and the node N2, when the clock signal CK changes to an ON level, it is possible to supply the node N1 with a sufficiently high-level potential by bootstrapping, thereby preventing the clock signal CK passing through the TFT Q3 from being distorted. In addition, by controlling the buffer control signals CR, CG, and CB to be at a high level for a time period that is shorter than the half cycle of the clock signal using the buffer control circuit 7, it is possible to output, from the buffer units 13r, 13g, and 13b, the output signals YR, YG, and YB that are turned to a high level for a time period that is shorter than the half cycle of the clock signal CK. In particular, by controlling the buffer control signals CR, CG, and CB to be at a high level respectively for periods not overlapping with each other using the buffer control circuit 7, it is possible to output, from the buffer units 13r, 13g, and 13b, the output signals YR, YG, and YB that are turned to a high level respectively for periods not overlapping with each other.

Further, by monolithically forming a scanning signal line drive circuit including the shift register 10 with a reduced circuit amount and low power consumption on a liquid crystal panel, it is possible to configure a liquid crystal display device with a reduced area of the picture-frame portion of the liquid crystal panel and low power consumption.

(Second Embodiment)

A shift register according to a second embodiment of the present invention has the same circuit configuration as the shift register 10 according to the first embodiment (see FIGS. 2 and 3). In this embodiment, the buffer control signals CR, CG, and CB change at timing different from that in the first embodiment. In the following, differences from the first embodiment will be described.

Figure 5:
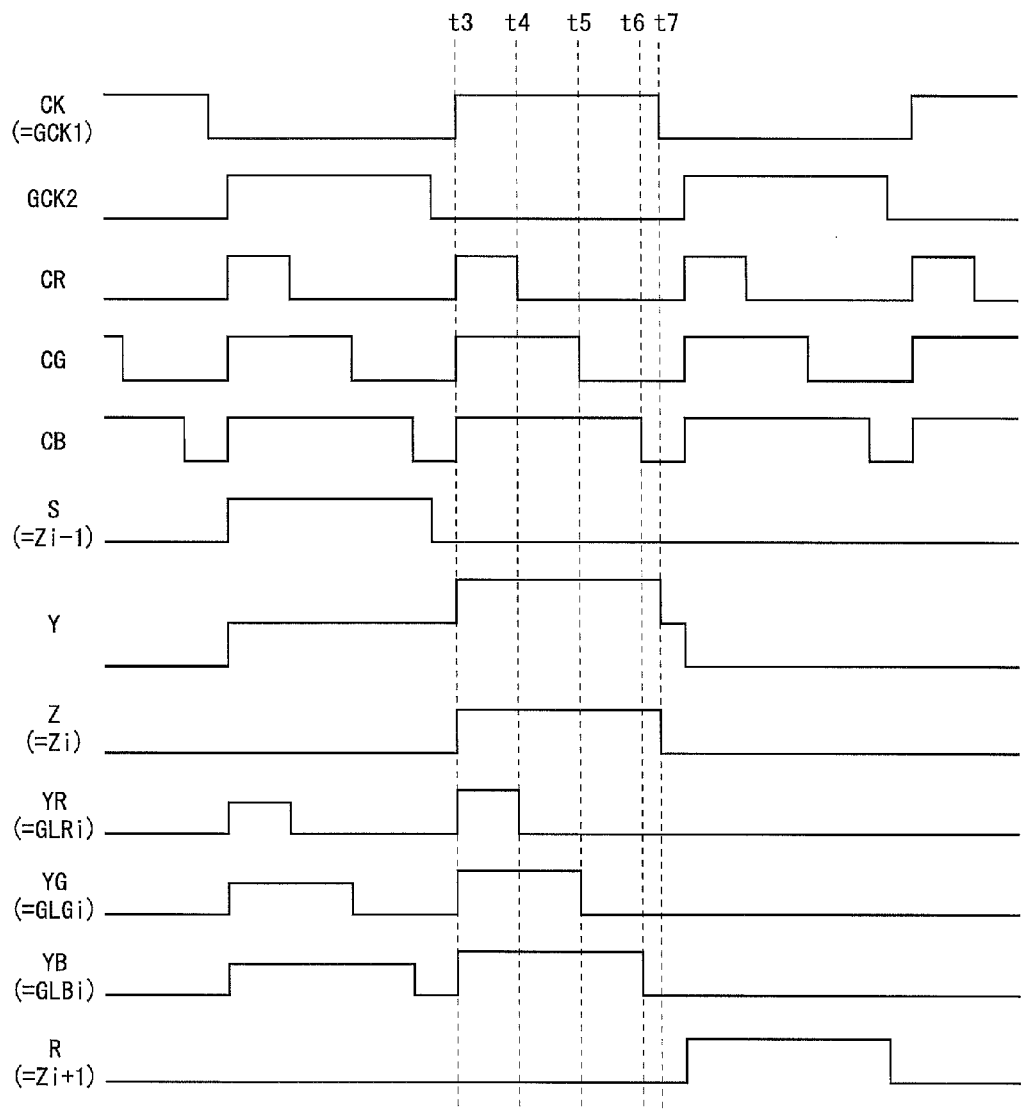
FIG. 5 is a timing chart of a shift register according to a second embodiment of the present invention.

FIG. 5 is a timing chart of the shift register according to this embodiment. According to the first embodiment (FIG. 4), the buffer control signals CR, CG, and CB change to a high level respectively at times t3, t4, and t5. By contrast, according to this embodiment (FIG. 5), all of the buffer control signals CR, CG, and CB change to a high level at time t3. Therefore, the output signal YR is at a high level from time t3 to time t4, the output signal YG is at high level from time t3 to time t5, and the output signal YB is at a high level from time t3 to time t6. The clock signal CK changes to a low level at time t7, and the buffer control signals CR, CG, and CB change to a low level before this.

As described above, the buffer control circuit 7 according to this embodiment controls the buffer control signals CR, CG, and CB to be at a high level at the same timing, and to be at a low level at timing different from each other. Further, the buffer control circuit 7 controls the buffer control signals CR, CG, and CB to be at a low level before the clock signal supplied to the shift unit 12 changes to a low level.

Here, a case in which the clock signal CK and the buffer control signals CR, CG, and CB change to a high level at different timing is considered. A boost voltage $\Delta V1$ at the node N1 in this case is given by an expression (4) shown below. By contrast, in the shift register according to this embodiment, the clock signal CK and the buffer control signals CR, CG, and CB change to a high level at the same timing. A boost voltage $\Delta V2$ at the node N1 in this case is given by an expression (5) shown below.

$$\Delta V1 = \Delta CK \times (Ct0+Ct3)/(Ct0+Ct1+Ct2+Ct3+Ct5) \quad (4)$$

$$\Delta V2 = \Delta CK \times (Ct0+Ct3+Ct5)/(Ct0+Ct1+Ct2+Ct3+Ct5) \quad (5)$$

Here, in the expressions (4) and (5), $\Delta CK$ represents a voltage amplitude of the clock signal CK, Ct0 represents a capacitance value of the capacitor Cap1, Ct1 to Ct3 respectively represent capacitance values of the TFTs Q1 to Q3, and Ct5 represents a total of capacitance values of the TFTs Q5r, Q5g, and Q5b.

From the expressions (4) and (5), it is found that $\Delta V1 < \Delta V2$. In the shift register according to this embodiment, as the buffer control signals CR, CG, and CB change to a high level at the same timing, the boost voltage at the node N1 rises and driving capabilities of the TFTs Q5r, Q5g, and Q5b increase. Therefore, it is possible to change the output signals YR, YG, and YB to a high level in a short time, and to change the potential of the scanning signal lines to a high level in a short time.

As described above, in the shift register according to this embodiment, by controlling the buffer control signals CR, CG, and CB to be at a high level at the same timing using the buffer control circuit 7, it is possible to change the potential at the node N1 largely, to increase the driving capabilities of the TFTs Q5r, Q5g, and Q5b, and to change the output signals YR, YG, and YB outputted from the buffer units 13r, 13g, and 13b to a high level in a short time.

Further, by controlling the buffer control signals CR, CG, and CB to be at a low level before the clock signal CK changes to a low level using the buffer control circuit 7, it is possible to control the buffer control signals CR, CG, and CB to be at a low level while applying a sufficiently high-level potential to the node N1, and to change the output signals YR, YG, and YB outputted from the buffer units 13r, 13g, and 13b to a low level in a short time.

(Third Embodiment)

A shift register according to a third embodiment of the present invention has the same circuit configuration as the shift register 10 according to the first embodiment (see FIGS. 2 and 3). The shift register according to this embodiment is configured such that a function for performing partial driving is added to the shift register according to the second embodiment. In the following, differences from the second embodiment will be described.

Figure 6:
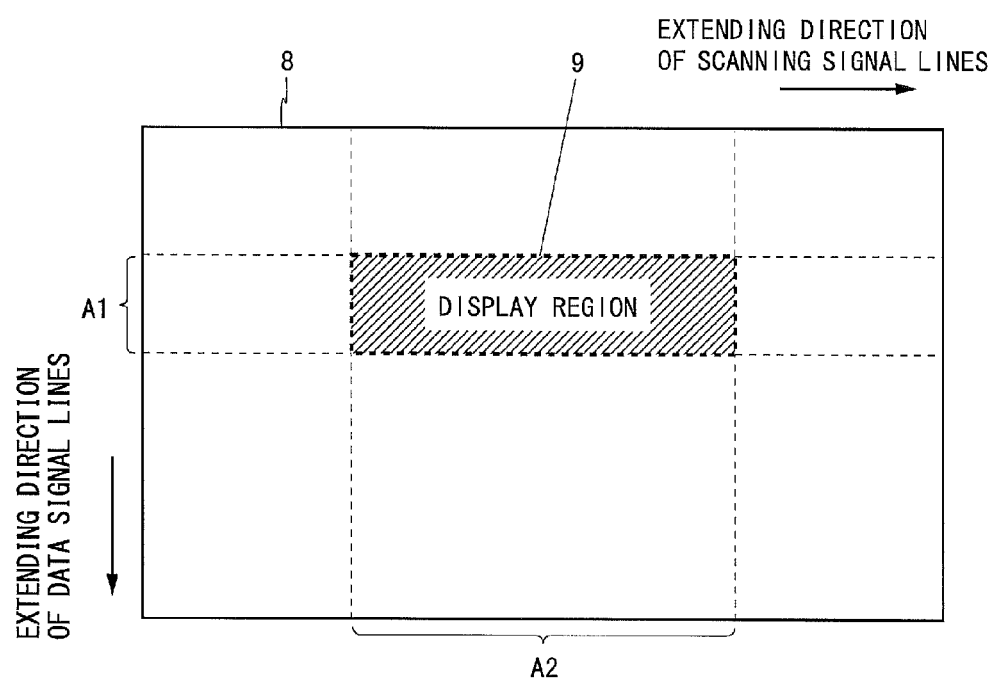
FIG. 6 is a diagram illustrating an example of a display screen by partial driving.

FIG. 6 is a diagram illustrating an example of a display screen by partial driving. In a display screen 8 shown in FIG. 6, a display region 9 is set. The scanning signal line drive circuit 2 only drives scanning signal lines that correspond to the display region 9 (scanning signal lines within a range A1) among the plurality of scanning signal lines provided in the pixel region. The data signal line drive circuit 3 only drives data signal lines that correspond to the display region 9 (data signal lines within a range A2) among the plurality of data signal lines provided in the pixel region. By performing partial driving in this manner, it is possible to cause the drive circuits of the display panel to operate partially according to the display region 9, thereby reducing power consumption of the display device.

Figure 7:
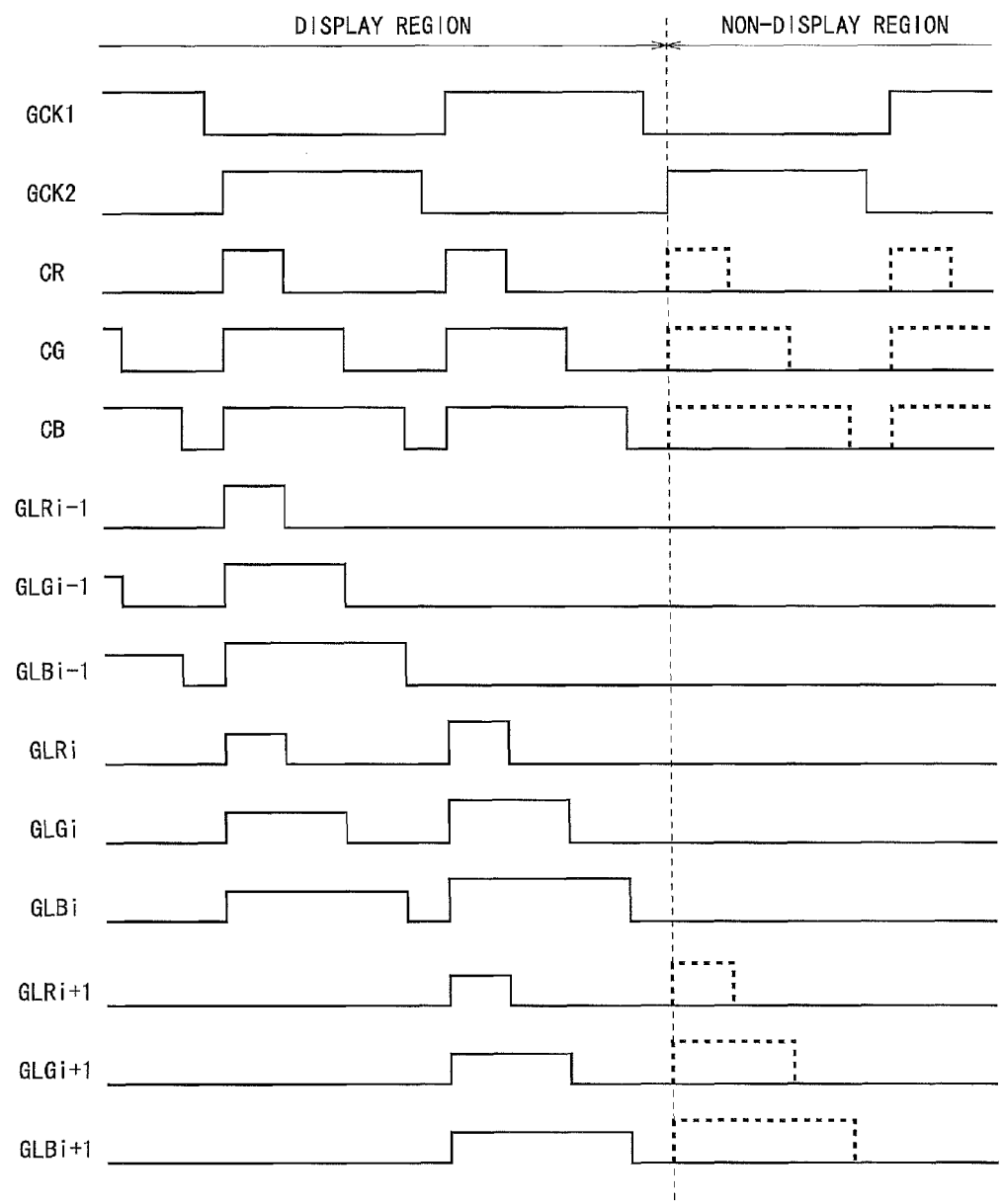
FIG. 7 is a timing chart of a shift register according to a third embodiment of the present invention.

FIG. 7 is a timing chart of the shift register according to this embodiment. Here, a case in which a portion including the scanning signal line GLBi and therebefore corresponds to the display region and a portion from a scanning signal line GLRi+1 and thereafter corresponds to a non-display region is described. In this case, in a horizontal period that corresponds to the scanning signal lines GLRi, GLGi, and GLBi, the buffer control signals CR, CG, and CB change at the same timing as those in the second embodiment (see FIG. 5). Therefore, the potentials of the scanning signal lines GLRi, GLGi, and GLBi become a high level only for a predetermined time. By contrast, in a horizontal period that corresponds to scanning signal lines GLRi+1, GLGi+1, and GLBi+1, the buffer control signals CR, CG, and CB are fixed to a low level (see FIG. 7). Therefore, the potentials of the scanning signal lines GLRi+1, GLGi+1, and GLBi+1 remain at a low level.

In this manner, the buffer control circuit 7 according to this embodiment has a function for fixing the buffer control signals CR, CG, and CB to a low level during a specified period (the horizontal periods that correspond to the non-display region). However, as the second signal Z outputted from the shift unit 12 becomes a high level for a predetermined time even in the horizontal periods that correspond to the non-display region, the shift operation is performed correctly.

As described above, according to the shift register of this embodiment, by providing the buffer control circuit 7 having the function for fixing the buffer control signals CR, CG, and CB to a low level during the specified period, it is possible to configure a shift register suitable for a scanning signal line drive circuit of a liquid crystal display device capable of performing partial driving. Further, by performing partial driving in the liquid crystal display device, it is possible to cause the drive circuits of the display panel to operate partially, thereby reducing power consumption.

(Fourth Embodiment)

A shift register according to a fourth embodiment of the present invention has the same circuit configuration as the shift register 10 according to the first embodiment (see FIGS. 2 and 3). The shift register according to this embodiment is configured such that a function for operating in a monochrome mode is added to the shift register according to the second embodiment. In the following, differences from the second embodiment will be described.

Figure 8:
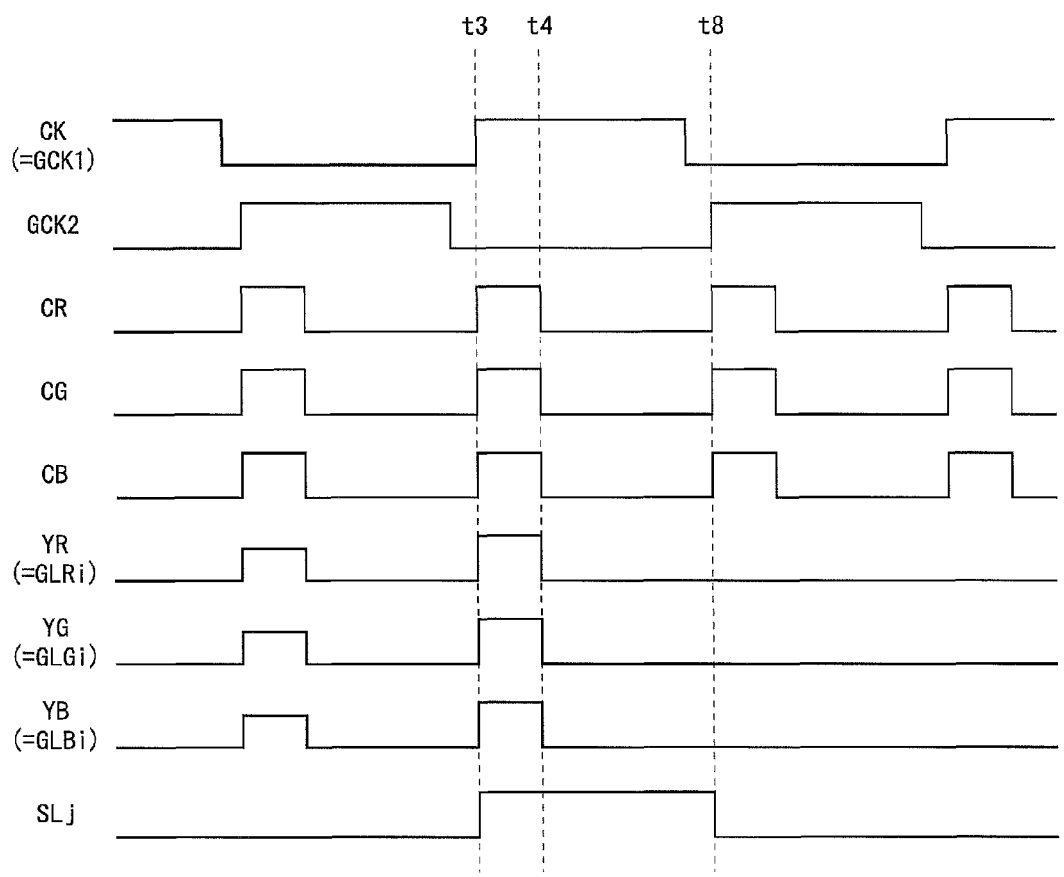
FIG. 8 is a timing chart of a shift register according to a fourth embodiment of the present invention.

FIG. 8 is a timing chart of the shift register according to this embodiment. The shift register according to this embodiment operates either in a color mode or in a monochrome mode. In the color mode, the buffer control signals CR, CG, and CB change at the same timing as those in the second embodiment (see FIG. 5). Therefore, the output signal YR is at a high level from time t3 to time t4, the output signal YG is at a high level from time t3 to time t5, and the output signal YB is at a high level from time t3 to time t6. By contrast, in the monochrome mode, all of the buffer control signals CR, CG, and CB are at a high level from time t3 to time t4 (see FIG. 8). Therefore, all of the output signals YR, YG, and YB are at a high level from time t3 to time t4.

In this manner, the buffer control circuit 7 according to this embodiment has the function for controlling the buffer control signals CR, CG, and CB to be at a high level during the periods different from each other, and the function for controlling the buffer control signals CR, CG, and CB to be at a high level during the same period.

As described above, according to the shift register of this embodiment, by providing the buffer control circuit 7 having the function for controlling the buffer control signals CR, CG, and CB to be at a high level during the periods different from each other and the function for controlling the buffer control signals CR, CG, and CB to be at a high level during the same period, it is possible to configure a shift register suitable for a scanning signal line drive circuit of a liquid crystal display device capable of switching between color display and monochrome display. By employing monochrome display in the liquid crystal display device, it is possible to reduce the number of times for charge and discharge of the data signal lines, thereby reducing power consumption.

(Fifth Embodiment)

Figure 9:
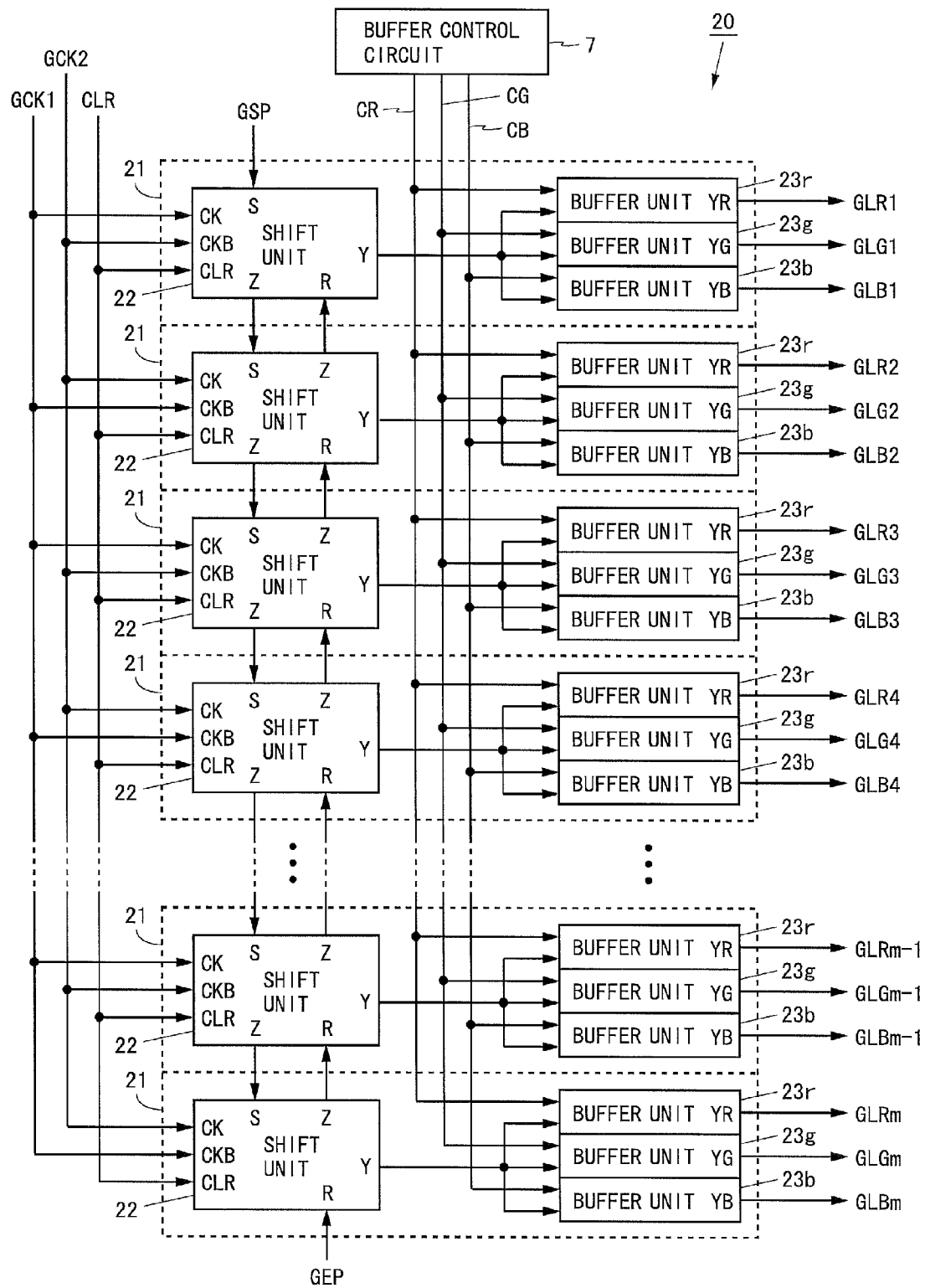
FIG. 9 is a block diagram illustrating a configuration of a shift register according to a fifth embodiment of the present invention.

FIG. 9 is a block diagram illustrating a configuration of a shift register according to a fifth embodiment of the present invention. A shift register 20 shown in FIG. 9 is configured such that m unit circuits 21 are in a multi-stage cascade connection. Each of the unit circuits 21 includes a shift unit 22 and three buffer units 23r, 23g, and 23b. The shift unit 22 and the buffer units 23r, 23g, and 23b are connected in the same manner as in the first embodiment. However, in the shift register 20, the gate clock GCK2 is inputted as a clock signal CKB to the shift unit 22 in an odd-numbered stage, and the gate clock GCK1 is inputted as a the clock signal CKB to the shift unit 22 in an even-numbered stage. Further, to each of the shift units 22, a clear signal CLR outputted from the display control circuit 1 is inputted.

Figure 10:
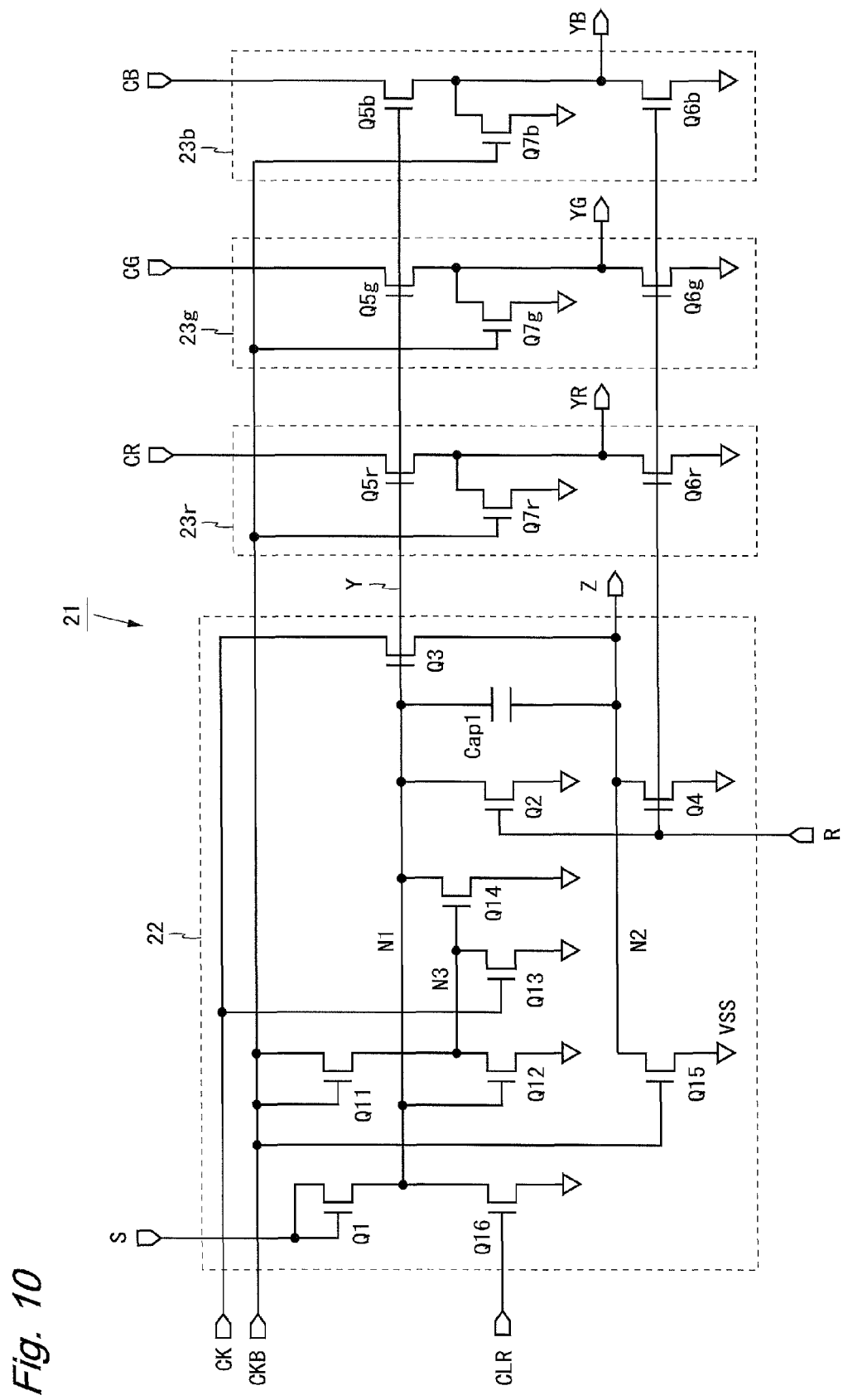
FIG. 10 is a circuit diagram of a unit circuit of the shift register shown in FIG. 9.

FIG. 10 is a circuit diagram of the unit circuit 21. As illustrated in FIG. 10, the shift unit 22 is configured such that TFTs Q11 to Q16 are added to the shift unit 12 according to the first embodiment. The buffer unit 23r is configured such that a TFT Q7r is added to the buffer unit 13r according to the first embodiment. The buffer units 23g and 23b have the same configuration as the buffer unit 23r. All the TFTs included in the unit circuit 21 are of the N-channel type.

In the shift unit 22, the TFTs Q1 to Q4 and the capacitor Cap1 are connected in the same manner as in the shift unit 12. A gate of the TFT Q12 and drains of the TFTs Q14 and Q16 are connected to the node N1. A drain of the TFT Q15 is connected to the node N2. A source of the TFT Q11, drains of the TFTs Q12 and Q13, and a gate of the TFT Q14 are connected to a node N3. To a gate of the TFT Q13, the clock signal CK is supplied. To a drain of the TFT Q11 and gates of the TFTs Q11 and Q15, the clock signal CKB is supplied. To a gate of the TFT Q16, the clear signal CLR is supplied. To sources of the TFTs Q12 to Q16, the low-level supply potential VSS is supplied. The TFT Q12 has a driving capability higher than that of the TFT Q11.

In the buffer unit 23r, the TFTs Q5r and Q6r are connected in the same manner as in the buffer unit 13r. A drain of the TFT Q7r is connected to the first output node. To a gate of the TFT Q7, the clock signal CKB is supplied. To a source of the TFT Q7r, the low-level supply potential VSS is supplied.

Figure 11:
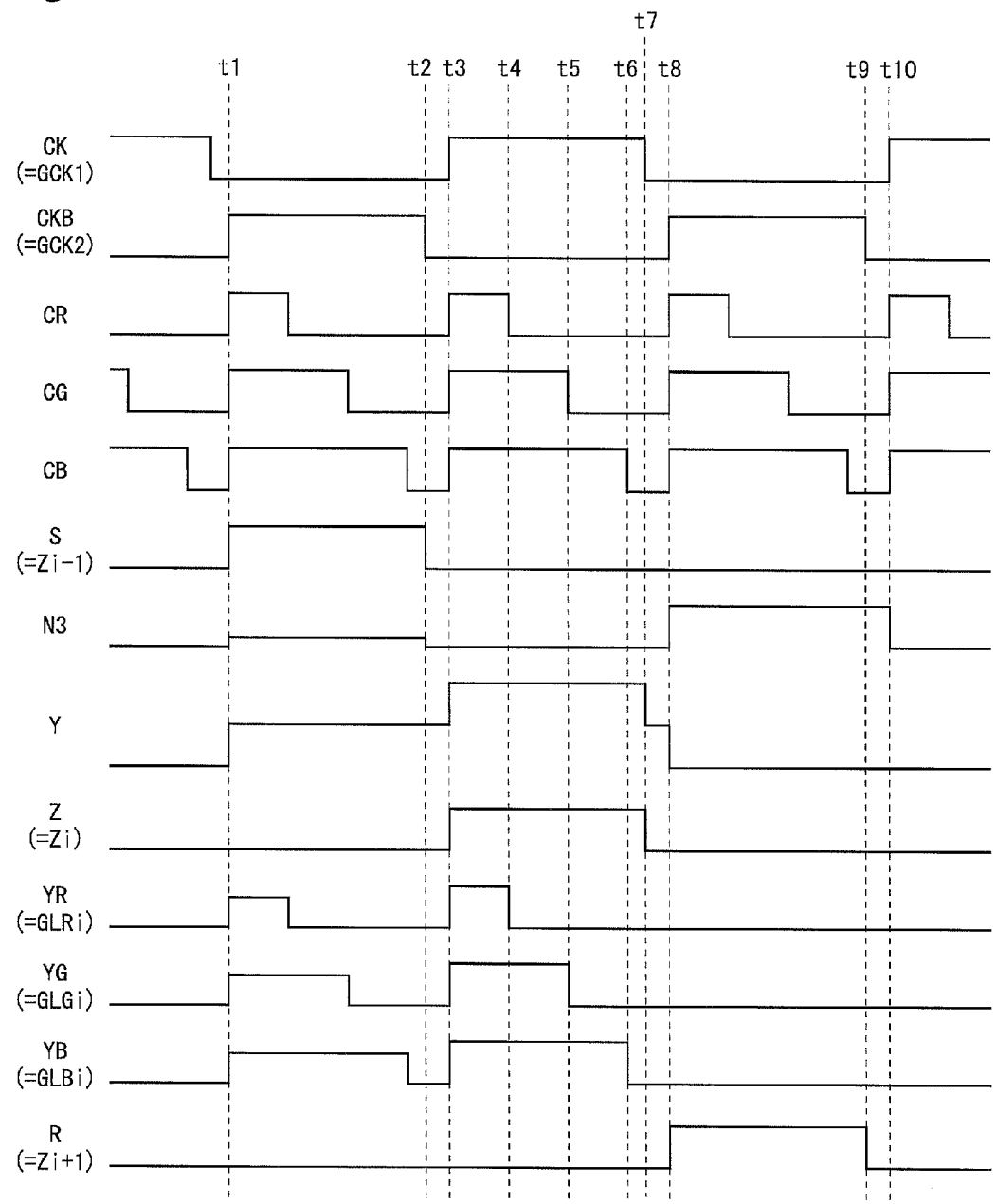
FIG. 11 is a timing chart of the shift register shown in FIG. 9.
Figure 12:
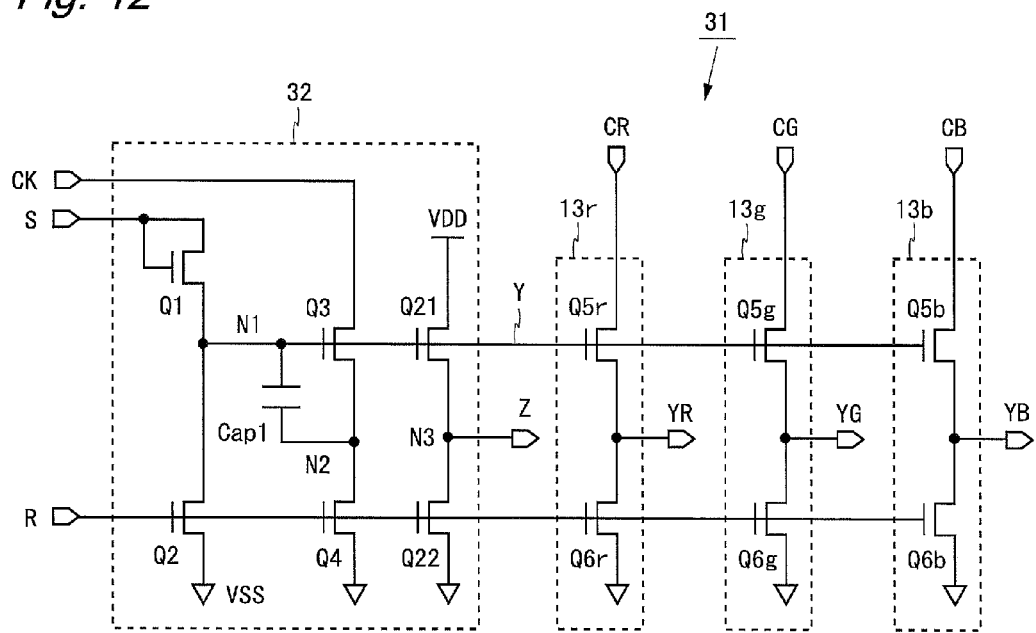
FIG. 12 is a circuit diagram of a unit circuit of a shift register according to a first modified example of the present invention.

FIG. 11 is a timing chart of the shift register 20. The timing chart shown in FIG. 11 is such that the change of a potential at the node N3 is added to the timing chart shown in FIG. 5. At time t1, when the set signal S changes to a high level, the TFT Q1 is turned to the ON state, and the potential at the node N1 (the first signal Y) becomes a high level. With this, the TFT Q12 is turned to the ON state. Further, at time t1, as the clock signal CKB changes to a high level, the TFTs Q11 and Q15 are turned to the ON state. As the TFT Q12 has a driving capability higher than that of the TFT Q11, the potential at the node N3 is substantially at a low level when the TFTs Q11 and Q12 are both in the ON state. Therefore, the TFT Q14 remains in the OFF state.

Then, at time t2, when the set signal S changes to a low level, the TFT Q1 is turned to the OFF state and the node N1 becomes a high impedance state. Further, at time t2, as the clock signal CKB changes to the OFF state, the TFTs Q11 and Q15 are turned to the OFF state.

Next, at time t3, when the clock signal CK changes to a high level, similarly to the second embodiment, the potential at the node N2 (the second signal Z) becomes a high level, and the potential at the node N1 rises higher than the normal high level due to bootstrapping. Further, at time t3, the TFT Q13 is turned to the ON state, and the potential at the node N3 becomes a low level. At this time, the TFT Q14 remains in the OFF state. From time t3 to time t7, the shift register 20 operates in the same manner as the shift register according to the second embodiment.

Then, at time t7, when the clock signal CK changes to a low level, the potential at the node N2 becomes a low level and the potential at the node N1 becomes the normal high level. Further, at time t7, the TFT Q13 is turned to the OFF state and the node N3 becomes a high impedance state.

Next, at time t8, when the reset signal R changes to a high level, the TFTs Q2, Q4, Q6r, Q6g, and Q6b are turned to the ON state, and the potentials at the nodes N1 and N2 and the first to third output nodes become a low level. Further, at time t8, as the clock signal CKB changes to a high level, the TFT Q11 is turned to the ON state. Therefore, when the potential at the node N1 falls down and the TFT Q12 is turned to the OFF state, the potential at the node N3 becomes a high level and the TFT Q14 is turned to the ON state. Thus, the low-level supply potential VSS is applied to the node N1. Further, when the clock signal CKB changes to a high level, the TFTs Q7r, Q7g, Q7b, and Q15 are turned to the ON state. When the TFT Q15 is turned to the ON state, the low-level supply potential VSS is applied to the node N2. When the TFTs Q7r, Q7g, and Q7b are turned to the ON state, the low-level supply potential VSS is applied to the first to third output nodes.

Next, at time t9, when the reset signal R changes to a low level, the TFTs Q2, Q4, Q6r, Q6g, and Q6b are turned to the OFF state. Further, at time t9, as the clock signal CKB changes to a low level, the TFTs Q7r, Q7g, Q7b, Q11, and Q15 are turned to the OFF state. Then, at time t10, the clock signal CK changes to a high level. With this, the TFT Q13 is turned to the ON state, and the potential at the node N3 becomes a low level.

In this manner, the TFTs Q11 to Q14 constitute a circuit for applying a low-level potential to the node N1 according to a signal (the clock signal CKB) other than the reset signal R.

The TFT Q15 functions as a transistor for applying a low-level potential to the node N2 according to a signal (the clock signal CKB) other than the reset signal R. The TFTs Q7r, Q7g, and Q7b function as transistors for applying a low-level potential respectively to the first to third output nodes according to a signal (the clock signal CKB) other than the reset signal R.

As described above, according to the shift register 20 of this embodiment, by providing the shift unit 22 with the circuit for applying a low-level potential to the node N1 according to the signal other than the reset signal R, it is possible to surely control the potential at the node N1 to be at the OFF level, thereby preventing malfunction of the shift register 20. Further, by providing the shift unit 22 with the TFT Q15 for applying a low-level potential to the node N2 according to the signal other than the reset signal, it is possible to surely control the potential at the node N2 to be at a low level, thereby preventing malfunction of the shift register 20. Moreover, by providing the buffer units 23r, 23g, and 23b respectively with the TFTs Q7r, Q7g, and Q7b for applying a low-level potential to the first to third output nodes according to the signal other than the reset signal, it is possible to surely control the output signals YR, YG, and YB to be at a low level, thereby preventing malfunction of the shift register 20. Furthermore, by providing the shift unit 22 with the TFT Q16 for applying a low-level potential to the node N1 according to the clear signal CLR, it is possible to surely control the potential at the node N1 to be at a low level when clearing, thereby stabilizing an initial operation of the shift register 20.

For the shift register according to the embodiments of the present invention, various modified examples can be configured. FIGS. 12 to 16 are circuit diagrams of a unit circuit of a shift register according to first to fifth modified examples of the present invention. A unit circuit 31 shown in FIG. 12 includes a shift unit 32 and the three buffer units 13r, 13g, and 13b. The shift unit 32 is configured such that TFTs Q21 and Q22 are added to the shift unit 12 according to the first embodiment. A source of the TFT Q21 and a drain of the TFT Q22 are connected to the node N3 through which the second signal Z is outputted. A high-level supply potential VDD is supplied to a drain of the TFT Q21, and a gate of the TFT Q21 is connected to the node N1. The low-level supply potential VSS is supplied to a source of the TFT Q22, and a gate of the TFT Q22 is supplied with the reset signal R. The TFT Q21 functions as a seventh transistor provided between a power supply node having a high-level potential and the node N3, and having a control terminal connected to the node N1. The TFT Q22 functions as an eighth transistor provided between a power supply node having a low-level potential and the node N3, and having a control terminal to which the reset signal R is supplied. According to the shift register of the first modified example, by providing the shift unit 32 with the two TFTs Q21 and Q22 that are connected to the power supply nodes, it is possible to apply, to the node N3, an ON potential and an OFF potential that are supplied from the power source. By supplying, to the previous-stage unit circuit and the subsequent-stage unit circuit, the second signal Z outputted from the node N3, it is possible to prevent malfunction of the shift register.

Figure 13:
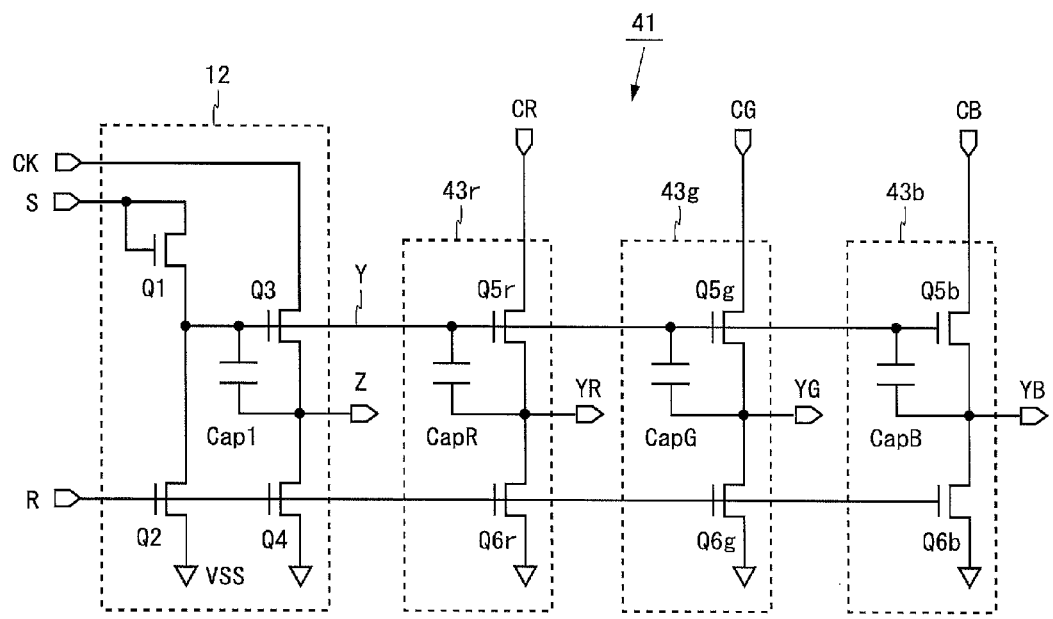
FIG. 13 is a circuit diagram of a unit circuit of a shift register according to a second modified example of the present invention.

A unit circuit 41 shown in FIG. 13 includes the shift unit 12 and three buffer units 43r, 43g, and 43b. The buffer unit 43r is configured such that a capacitor CapR is added to the buffer unit 13r according to the first embodiment. One electrode of the capacitor CapR is connected to the node N1, and the other electrode of the capacitor CapR is connected to the first output node. The buffer units 43g and 43b have the same configuration as that of the buffer unit 43r. According to the shift register of the second modified example, by providing capacitors CapR, CapG, and CapB respectively between the node N1 and the first to third output nodes, it is possible to prevent distortion of the buffer control signals CR, CG, and CB respectively passing the TFTs Q5r, Q5g, and Q5b by supplying a sufficiently high-level potential to the node N1 due to bootstrapping when the buffer control signals CR, CG, and CB change to a high level.

Figure 14:
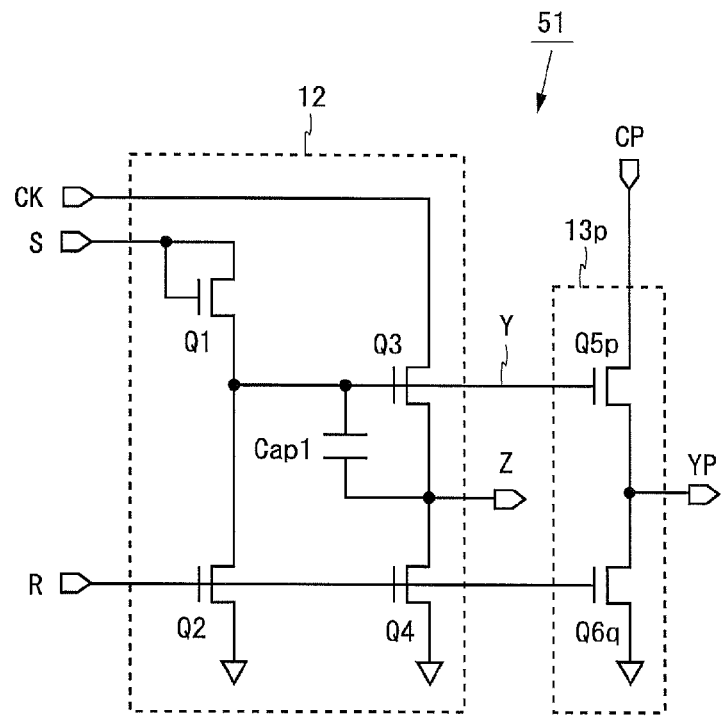
FIG. 14 is a circuit diagram of a unit circuit of a shift register according to a third modified example of the present invention.

A unit circuit 51 shown in FIG. 14 includes the shift unit 12 and a single buffer unit 13p. The buffer unit 13p outputs an output signal YP based on the first signal Y, a buffer control signal CP, and the reset signal R. By connecting the m unit circuit 51 in a multi-stage cascade connection, it is possible to configure a shift register that outputs m signals in total including a single signal from each stage. This shift register can be used for a scanning signal line drive circuit that performs single scanning for driving a single scanning signal line in a single horizontal period.

Figure 15:
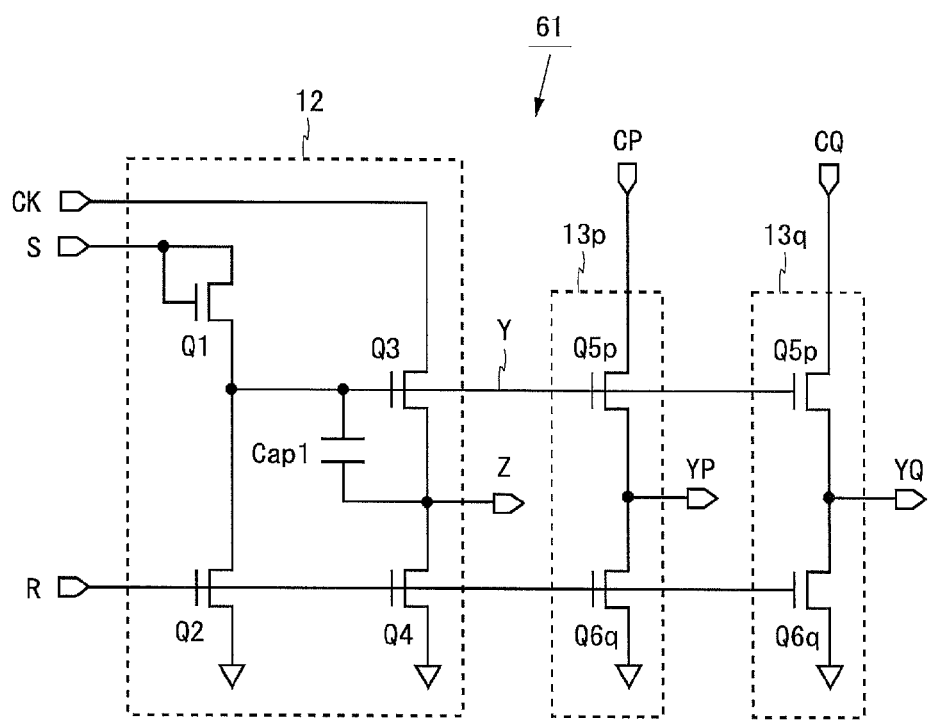
FIG. 15 is a circuit diagram of a unit circuit of a shift register according to a fourth modified example of the present invention.

A unit circuit 61 shown in FIG. 15 includes the shift unit 12 and two buffer units 13p and 13q. The buffer unit 13q outputs an output signal YQ based on the first signal Y, a buffer control signal CQ, and the reset signal R. By connecting the m unit circuit 61 in a multi-stage cascade connection, it is possible to configure a shift register that outputs 2m signals in total including two signals from each stage. This shift register can be used for a scanning signal line drive circuit that performs double scanning for driving two scanning signal lines in a single horizontal period.

Figure 16:
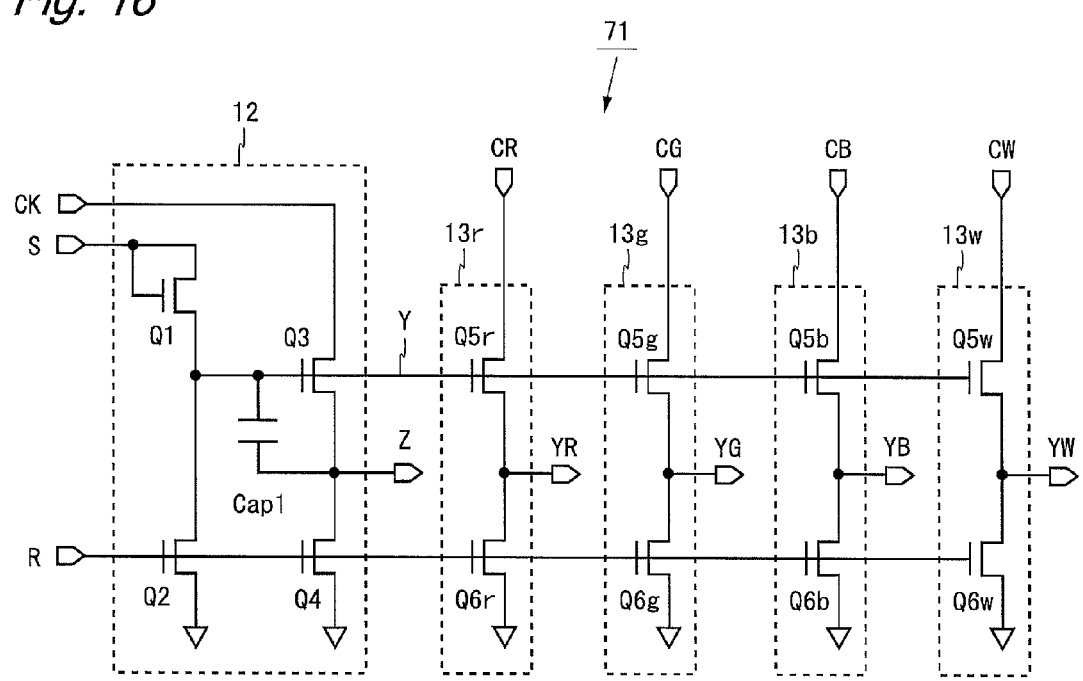
FIG. 16 is a circuit diagram of a unit circuit of a shift register according to a fifth modified example of the present invention.

A unit circuit 71 shown in FIG. 16 includes the shift unit 12 and four buffer units 13r, 13g, 13b, and 13w. The buffer unit 13w outputs an output signal YW based on the first signal Y, a buffer control signal CW, and the reset signal R. By connecting the m unit circuit 71 in a multi-stage cascade connection, it is possible to configure a shift register that outputs 4m signals in total including four signals from each stage. This shift register can be used for a scanning signal line drive circuit that performs quad scanning for driving four scanning signal lines in a single horizontal period. As described above, in the shift register according to the present invention, the number of the buffer units included in one unit circuit may be arbitrary.

Figure 17:
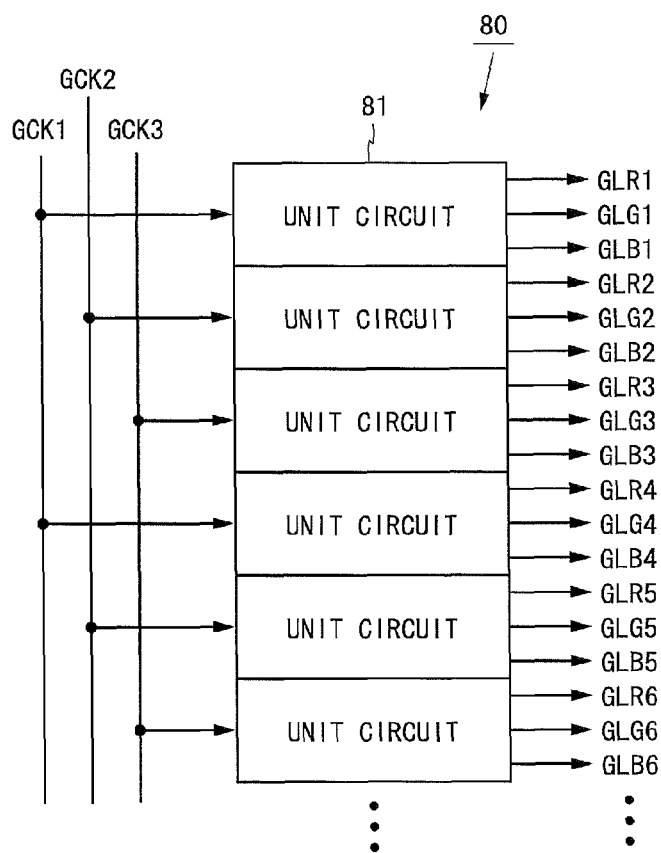
FIG. 17 is a block diagram illustrating a configuration of a shift register according to a sixth modified example of the present invention.

FIG. 17 is a block diagram illustrating a configuration of a shift register according to a sixth modified example of the present invention. A shift register 80 shown in FIG. 17 is configured such that unit circuits 81 are in a multi-stage cascade connection, and capable of outputting 3m signals in total including three signals from each stage. The shift register 80 operates according to gate clocks GCK1, GCK2, and GCK3 of three phases. Similarly to the unit circuit 11 according to the first embodiment, the unit circuit 81 includes a shift unit and three buffer units (neither of which is depicted). As the shift unit, a circuit (can have any circuit configuration) of a single stage in a shift register that operates according to the clock signals of three phases is used. As the buffer unit, a circuit having the same configuration as any of the buffer units 13r and 23r is used. As described above, the shift register according to the present invention may operate according to clock signals of three phases or more.

Further, it is possible to configure a variety of types of shift registers by appropriately combining features of the shift registers according to the embodiments and the modified examples described above. For example, the shift register 20 according to the fifth embodiment may operate according to the timing chart shown in FIG. 1. Further, the shift register 20 according to the fifth embodiment may be additionally provided with the function for performing partial driving, or the function for operating in the monochrome mode. Moreover, the unit circuit 21 according to the fifth embodiment may be additionally provided with the TFTs Q21 and Q22 (FIG. 12) or the capacitors CapR, CapG, and CapB (FIG. 13). Furthermore, it is possible to configure a display device other than the liquid crystal display device using the similar method.

As described above, the present invention can provide a shift register having a suitable configuration for being monolithically formed on a display panel, with a smaller circuit amount and lower power consumption, as well as a display device with a reduced picture-frame portion of a display panel and reduced power consumption using such a shift register.

INDUSTRIAL APPLICABILITY

The shift register according to the present invention has a feature that a circuit amount and power consumption are small, and therefore can be suitably used in a display device and the like, for example. The display device according to the present invention has a feature that an area of a picture-frame portion of the display panel and power consumption are small, and therefore can be used as various display devices such as a liquid crystal display device.

DESCRIPTION OF REFERENCE CHARACTERS

1: DISPLAY CONTROL CIRCUIT
2: SCANNING SIGNAL LINE DRIVE CIRCUIT
3: DATA SIGNAL LINE DRIVE CIRCUIT
4: PIXEL REGION
5: PIXEL CIRCUIT
6: LIQUID CRYSTAL PANEL
7: BUFFER CONTROL CIRCUIT
8: DISPLAY SCREEN
9: DISPLAY REGION
10, 20, 80: SHIFT REGISTER
11, 21, 31, 41, 51, 61, 71, 81: UNIT CIRCUIT
12, 22, 32: SHIFT UNIT
13, 23, 43: BUFFER UNIT

The invention claimed is:

1. A shift register, comprising:
a buffer control circuit configured to output at least three buffer control signals; and
a plurality of unit circuits in a multi-stage cascade connection and capable of outputting at least four signals from each stage according to the buffer control signals and a clock signal which is different from the buffer control signals, wherein
each of the unit circuits includes a shift unit which operates in accordance with the clock signal and at least three buffer units, each corresponding to one of the buffer control signals, the shift unit includes:
a first transistor configured to apply an ON potential to a first node according to a set signal;
a second transistor configured to apply an OFF potential to the first node according to a reset signal;
a third transistor provided between an input node for the clock signal and a second node, and having a control terminal connected to the first node; and
a fourth transistor configured to apply an OFF potential to the second node according to the reset signal,
each of the at least three buffer units includes:
an output node;
a fifth transistor configured to apply an ON potential to the output node based on a potential at the first node and a corresponding buffer control signal; and
a sixth transistor configured to apply an OFF potential to the output node according to the reset signal,
each of the at least three buffer units is configured to output an output signal from the output node,
the shift unit is configured to output a signal on the second node as the set signal of a next-stage unit circuit and the reset signal of a previous-stage unit circuit,
the buffer control circuit is configured to control the buffer control signals to be at an ON level for a time period shorter than a half cycle of the dock signal, and
the buffer control circuit controls the buffer control signals to be at an ON level respectively for periods not overlapping with each other, the period being included in an ON-level period of the clock signal in a horizontal period and to be at an OFF level before the clock change to an OFF level.

2. The shift register according to claim 1, wherein
the fifth transistor is provided between an input node for the buffer control signal and the output node, and has a control terminal connected to the first node.

3. The shift register according to claim 2, wherein
the shift unit further includes a capacitance between the first node and the second node.

4. The shift register according to claim 3, wherein
the buffer unit further includes a capacitance between the first node and the output node.

5. The shift register according to claim 1, wherein
the buffer control circuit has a function for fixing the buffer control signals to an OFF level during a specified period.

6. The shift register according to claim 1, wherein
the buffer control circuit has a function for controlling the buffer control signals to be at an ON level respectively during periods different from each other, and a function for controlling the buffer control signals to be at an ON level during a same period.

7. The shift register according to claim 1, wherein
the shift unit further includes a circuit for applying an OFF potential to the first node according to a signal other than the reset signal.

8. The shift register according to claim 1, wherein
the shift unit further includes a transistor for applying an OFF potential to the second node according to a signal other than the reset signal.

9. The shift register according to claim 1, wherein
the buffer unit further includes a transistor for applying an OFF potential to the output node according to a signal other than the reset signal.

10. The shift register according to claim 1, wherein
the shift unit further includes a transistor for applying an OFF potential to the first node according to a clear signal.

11. A display device, comprising:
a display panel including a pixel region in which a plurality of scanning signal lines are provided; and
a scanning signal line drive circuit including a shift register according to claim 1, and monolithically formed on the display panel.

* * * * *